(12) United States Patent
Han et al.

(10) Patent No.: US 12,219,143 B2
(45) Date of Patent: Feb. 4, 2025

(54) PROBABILITY ESTIMATION FOR VIDEO CODING

(71) Applicant: Google LLC, Mountain View, CA (US)

(72) Inventors: Jingning Han, Santa Clara, CA (US); Yue Sun, Mountain View, CA (US); Yaowu Xu, Saratoga, CA (US)

(73) Assignee: GOOGLE LLC, Mountain View, CA (US)

( * ) Notice: Subject to any disclaimer, the term of this patent is extended or adjusted under 35 U.S.C. 154(b) by 271 days.

(21) Appl. No.: 17/775,565

(22) PCT Filed: Nov. 9, 2020

(86) PCT No.: PCT/US2020/059594
§ 371 (c)(1),
(2) Date: May 9, 2022

(87) PCT Pub. No.: WO2021/092531
PCT Pub. Date: May 14, 2021

(65) Prior Publication Data
US 2023/0007260 A1    Jan. 5, 2023

Related U.S. Application Data

(60) Provisional application No. 62/932,508, filed on Nov. 8, 2019.

(51) Int. Cl.
*H04N 19/13* (2014.01)
*H04N 19/126* (2014.01)
*H04N 19/91* (2014.01)

(52) U.S. Cl.
CPC ........... *H04N 19/13* (2014.11); *H04N 19/126* (2014.11); *H04N 19/91* (2014.11)

(58) Field of Classification Search
CPC ....... H04N 19/13; H04N 19/126; H04N 19/91
USPC .................................................... 375/240.02
See application file for complete search history.

(56) References Cited

U.S. PATENT DOCUMENTS

| 2014/0140400 | A1* | 5/2014 | George | H04N 19/174 375/240.12 |
| 2018/0309990 | A1* | 10/2018 | Alshina | H04N 19/537 |
| 2019/0320177 | A1* | 10/2019 | George | H04N 19/513 |
| 2020/0365229 | A1* | 11/2020 | Fields | G16B 40/20 |
| 2020/0382929 | A1* | 12/2020 | Shi | G06N 3/063 |
| 2021/0126650 | A1* | 4/2021 | Kirchhoffer | H03M 7/02 |
| 2021/0227222 | A1* | 7/2021 | Lee | H04N 19/136 |

(Continued)

OTHER PUBLICATIONS

Alshina et al. "Non-CE1: Accurate Initialization and Conditional Probability for CABAC Performance Improvement" Feb. 2012 (Year: 2012).*

(Continued)

*Primary Examiner* — Matthew David Kim
(74) *Attorney, Agent, or Firm* — Young Basile Hanlon & MacFarlane, P.C.

(57) ABSTRACT

Entropy coding a sequence of symbols is described. A first probability model for entropy coding is selected. At least one symbol of the sequence is coded using a probability determined using the first probability model. The probability according to the first probability model is updated with an estimation of a second probability model to entropy code a subsequent symbol. The combination may be a fixed or adaptive combination.

20 Claims, 8 Drawing Sheets

(56) References Cited

U.S. PATENT DOCUMENTS

| | | | |
|---|---|---|---|
| 2022/0005229 A1* | 1/2022 | Li | G06T 9/001 |
| 2022/0046270 A1* | 2/2022 | Kim | H04N 19/463 |
| 2022/0239924 A1* | 7/2022 | Kirchhoffer | H04N 19/46 |
| 2023/0247201 A1* | 8/2023 | Alshina | H04N 19/91 |
| | | | 375/240.03 |

OTHER PUBLICATIONS

International Search Report and Written Opinion of International Application No. PCT/US2020/059594 dated Feb. 17, 2021; 16 pages.

Alshina E et al: "Non-CE1: Accurate initialization and conditional probability for CABAC performance Improvement", 99. MPEG Meeting; San Jose; (Motion Picture Expert Group or ISO/IEC JTC1/SC29/WG11), Feb. 1, 2012.

Karwowski Damian: "Improved arithmetic coding in H.264/AVC using Context-Tree Weighting and prediction by Partial Matching", 15th European Signal Processing Conference, IEEE, Sep. 3, 2007, pp. 1270-1274.

Alshin A et al: "Multi-parameter probability up-date for CABAC", JCT-VC Meeting; 97. MPEG Meeting; Jul. 14, 2011-Jul. 22, 2011; Torino; (Joint Collaborative Team on Video Coding of ISO/IEC JTC1/SC29/WG11 and ITU-T SG.16 ); URL: http://wftp3.itu.int/av-arch/jctvc-site/, No. JCTVC-F254, Jul. 2, 2011.

Detlev Marpe et al: "Context-based adaptive binary arithmetic coding in the H.264/AVC video compression standard", May 21, 2003 (May 21, 2003), XP055382532, DOI: 10.1109/TCSVT.2003.815173 Retrieved from the Internet: URL:http://iphome.hhi.de/wiegand/assets/pdfs/csvt cabac 0305.pdf [retrieved on—Jun. 19, 2017].

Chen Yue et al: "An Overview of Core Coding Tools in the AV1 Video Codec", 2018 Picture Coding Symposium (PCS), IEEE, Jun. 24, 2018 (Jun. 24, 2018), pp. 41-45.

Sun Yue et al: "Online Probability Model Estimation for Video Compression", 2020 Data Compression Conference (DCC), IEEE, Mar. 24, 2020, pp. 263-272.

\* cited by examiner

PROBABILITY ESTIMATION FOR VIDEO CODING

CROSS-REFERENCE TO RELATED APPLICATION

This application claims priority to U.S. Provisional Patent Application No. 62/932,508, filed Nov. 8, 2019, the entire content of which is incorporated wherein in its entirety by reference.

BACKGROUND

Digital video streams may represent video using a sequence of frames or still images. Digital video can be used for various applications including, for example, video conferencing, high-definition video entertainment, video advertisements, or sharing of user-generated videos. A digital video stream can contain a large amount of data and consume a significant amount of computing or communication resources of a computing device for processing, transmission, or storage of the video data. Various approaches have been proposed to reduce the amount of data in video streams, including lossy and lossless compression techniques.

SUMMARY

Probability estimation is used for entropy coding, particularly with context-based entropy coding for lossless compression. A multimodal approach is described herein that uses multiple linear update models to accurately estimate probabilities.

An aspect of the teachings herein is a method for entropy coding a sequence of symbols (i.e., multiple symbols). The method can include determining a first probability model for entropy coding the sequence, the first probability model being one of a plurality of available probability models, entropy coding at least one symbol of the sequence using a probability determined by the first probability model, after entropy coding a respective symbol of the sequence, determining a first probability estimation to update the probability using the first probability model, for a subsequent symbol relative to the at least one symbol of the sequence, determining a second probability estimation using a second probability model, and entropy coding the subsequent symbol using the probability updated by a combination of the first probability estimation and the second probability estimation.

An aspect of the teachings herein is an apparatus for entropy coding a sequence of symbols including a processor. The processor is configured to determine a first probability model for entropy coding the sequence, the first probability model being one of a plurality of available probability models, entropy code at least one symbol of the sequence using a probability determined by the first probability model, after entropy coding a respective symbol of the sequence, determine a first probability estimation to update the probability using the first probability model, for a subsequent symbol relative to the at least one symbol of the sequence, determine a second probability estimation using a second probability model, and entropy code the subsequent symbol using the probability updated by a combination of the first probability estimation and the second probability estimation.

Aspects of this disclosure are disclosed in the following detailed description of the implementations, the appended claims, and the accompanying figures.

BRIEF DESCRIPTION OF THE DRAWINGS

The description herein makes reference to the accompanying drawings described below, wherein like reference numerals refer to like parts throughout the several views.

DETAILED DESCRIPTION

Figure 1:
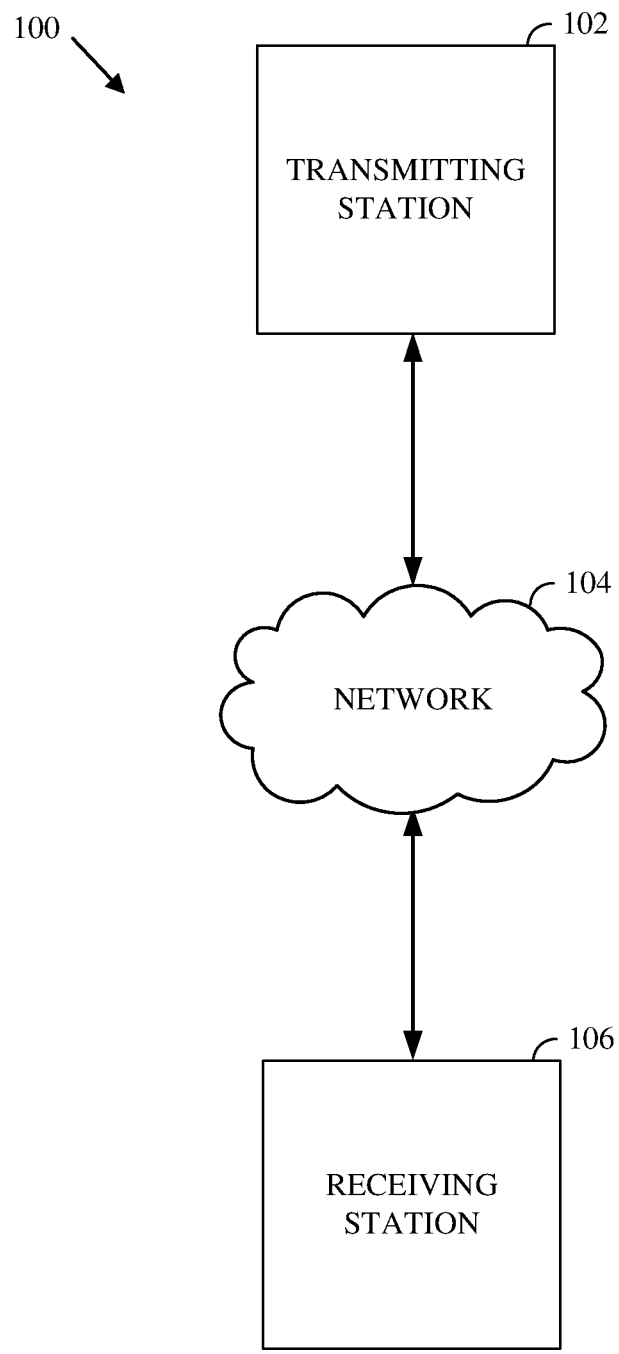
FIG. 1 is a schematic of an example of a video encoding and decoding system.

Video compression schemes may include breaking respective images, or frames, into smaller portions, such as blocks, and generating an encoded bitstream using techniques to limit the information included for respective blocks thereof. The encoded bitstream can be decoded to re-create or reconstruct the source images from the limited information. The information may be limited by lossy coding, lossless coding, or some combination of lossy and lossless coding.

One type of lossless coding is entropy coding, where entropy is generally considered the degree of disorder or randomness in a system. Entropy coding compresses a sequence in an informationally efficient way. That is, a lower bound of the length of the compressed sequence is the entropy of the original sequence. An efficient algorithm for entropy coding desirably generates a code (e.g., in bits) whose length approaches the entropy. For a sequence s with a length N, the entropy associated with binary codewords may be defined as equation (1), below:

$$\Sigma_{t=1}^{N} -\log_2(p(s_t|s_{t-1},\ldots,1)) := \Sigma_{t=1}^{N} -\log_2(p_t(s_t)) \qquad (1)$$

The variable p represents the probability of an individual symbol, and the variable $p_t$ represents the probability distribution of symbols at time t conditioned on the previously observed symbols. Arithmetic coding can use the probability to construct the codewords.

However, a coder does not receive a streaming sequence of symbols together with the probability distribution for the symbols. Instead, probability estimation may be used in video codecs to implement entropy coding. That is, the probability distribution of the symbols may be estimated. Where the estimation is $\hat{p}_t$, the codelength approaches equation (2) below:

$$\Sigma_{t=1}^{N} -\log_2(\hat{p}_t(s_t)) \qquad (2)$$

Stated differently, entropy coding may rely upon probability estimation models (also called probability models herein) that model the distribution of values occurring in an encoded bitstream. By using probability models based on a measured or estimated distribution of values so that $\hat{p}_t$ is close to $p_t$, entropy coding can reduce the number of bits required to represent the input data to close to a theoretical minimum (i.e., the lower bound).

In practice, the actual reduction in the number of bits required to represent video data can be a function of the accuracy of the probability model, the number of bits over which the coding is performed, and the computational accuracy of the (e.g., fixed-point) arithmetic used to perform the coding. A significant difficulty in the estimation is that the probability is time variant, which means that $p_t$ cannot be replaced by a single value p.

To address the time-variant nature of the probability, probability estimation is described herein that combines a probability estimation model, which is a first-order linear system, with another model to form a higher-order linear system. While the teachings herein may be used in either a one-pass or a two-pass coding system, the estimation of probability herein may be referred to as online estimation of probability because it is capable of use in a one-pass system with high efficiency. The available probability estimation models may be two or more model types including a context-adaptive binary arithmetic coding (CABAC) model, an AV1 model, a counting model, or any other probability estimation model or algorithm.

Implementations according to this disclosure can efficiently perform probability estimation for entropy coding, particularly with context-based entropy coding for lossless compression, by more accurately modeling the conditional probability of streaming symbols. The probability estimation contributes to efficient compression, reducing the number of bits required to represent video data. The probability estimation may be used in any probability estimation of a sequence of symbols but may be particularly effective for online probability estimation of such a sequence (e.g., real-time or delay sensitive applications of video coding).

Further details of estimating the probability for entropy coding symbols are described herein first with reference to a system in which the teachings may be incorporated.

FIG. 1 is a schematic of an example of a video encoding and decoding system 100. A transmitting station 102 can be, for example, a computer having an internal configuration of hardware such as that described in FIG. 2. However, other implementations of the transmitting station 102 are possible. For example, the processing of the transmitting station 102 can be distributed among multiple devices.

A network 104 can connect the transmitting station 102 and a receiving station 106 for encoding and decoding of the video stream. Specifically, the video stream can be encoded in the transmitting station 102, and the encoded video stream can be decoded in the receiving station 106. The network 104 can be, for example, the Internet. The network 104 can also be a local area network (LAN), wide area network (WAN), virtual private network (VPN), cellular telephone network, or any other means of transferring the video stream from the transmitting station 102 to, in this example, the receiving station 106.

Figure 2:
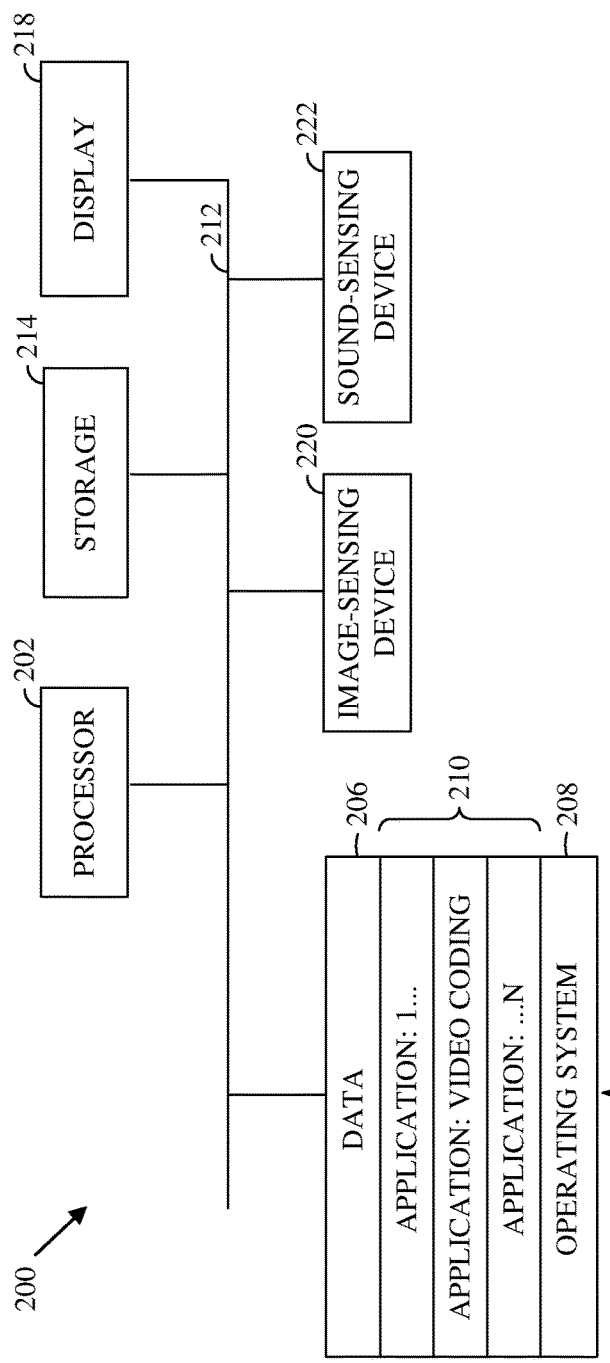
FIG. 2 is a block diagram of an example of a computing device that can implement a transmitting station or a receiving station.

The receiving station 106, in one example, can be a computer having an internal configuration of hardware such as that described in FIG. 2. However, other suitable implementations of the receiving station 106 are possible. For example, the processing of the receiving station 106 can be distributed among multiple devices.

Other implementations of the video encoding and decoding system 100 are possible. For example, an implementation can omit the network 104. In another implementation, a video stream can be encoded and then stored for later transmission to the receiving station 106 or any other device having memory. In one implementation, the receiving station 106 receives (e.g., via the network 104, a computer bus, and/or some communication pathway) the encoded video stream and stores the video stream for later decoding. In an example implementation, a real-time transport protocol (RTP) is used for transmission of the encoded video over the network 104. In another implementation, a transport protocol other than RTP may be used, e.g., a Hypertext Transfer Protocol-based (HTTP-based) video streaming protocol.

When used in a video conferencing system, for example, the transmitting station 102 and/or the receiving station 106 may include the ability to both encode and decode a video stream as described below. For example, the receiving station 106 could be a video conference participant who receives an encoded video bitstream from a video conference server (e.g., the transmitting station 102) to decode and view and further encodes and transmits his or her own video bitstream to the video conference server for decoding and viewing by other participants.

In some implementations, the video encoding and decoding system 100 may instead be used to encode and decode data other than video data. For example, the video encoding and decoding system 100 can be used to process image data. The image data may include a block of data from an image. In such an implementation, the transmitting station 102 may be used to encode the image data and the receiving station 106 may be used to decode the image data. Alternatively, the receiving station 106 can represent a computing device that stores the encoded image data for later use, such as after receiving the encoded or pre-encoded image data from the transmitting station 102. As a further alternative, the transmitting station 102 can represent a computing device that decodes the image data, such as prior to transmitting the decoded image data to the receiving station 106 for display.

FIG. 2 is a block diagram of an example of a computing device 200 that can implement a transmitting station or a receiving station. For example, the computing device 200 can implement one or both of the transmitting station 102 and the receiving station 106 of FIG. 1. The computing device 200 can be in the form of a computing system including multiple computing devices, or in the form of one computing device, for example, a mobile phone, a tablet computer, a laptop computer, a notebook computer, a desktop computer, and the like.

A processor 202 in the computing device 200 can be a conventional central processing unit. Alternatively, the processor 202 can be another type of device, or multiple devices, capable of manipulating or processing information now existing or hereafter developed. For example, although the disclosed implementations can be practiced with one processor as shown (e.g., the processor 202), advantages in speed and efficiency can be achieved by using more than one processor.

A memory 204 in computing device 200 can be a read only memory (ROM) device or a random-access memory (RAM) device in an implementation. However, other suitable types of storage device can be used as the memory 204. The memory 204 can include code and data 206 that is accessed by the processor 202 using a bus 212. The memory 204 can further include an operating system 208 and application programs 210, the application programs 210 including at least one program that permits the processor 202 to perform the techniques described herein. For example, the application programs 210 can include applications 1 through N, which further include a video coding application that performs the techniques described herein. The computing device 200 can also include a secondary storage 214, which can, for example, be a memory card used with a mobile computing device. Because the video communication sessions may contain a significant amount of information, they can be stored in whole or in part in the secondary storage 214 and loaded into the memory 204 as needed for processing.

The computing device 200 can also include one or more output devices, such as a display 218. The display 218 may be, in one example, a touch sensitive display that combines a display with a touch sensitive element that is operable to sense touch inputs. The display 218 can be coupled to the processor 202 via the bus 212. Other output devices that permit a user to program or otherwise use the computing device 200 can be provided in addition to or as an alternative to the display 218. When the output device is or includes a display, the display can be implemented in various ways, including by a liquid crystal display (LCD), a cathode-ray tube (CRT) display, or a light emitting diode (LED) display, such as an organic LED (OLED) display.

The computing device 200 can also include or be in communication with an image-sensing device 220, for example, a camera, or any other image-sensing device 220 now existing or hereafter developed that can sense an image such as the image of a user operating the computing device 200. The image-sensing device 220 can be positioned such that it is directed toward the user operating the computing device 200. In an example, the position and optical axis of the image-sensing device 220 can be configured such that the field of vision includes an area that is directly adjacent to the display 218 and from which the display 218 is visible.

The computing device 200 can also include or be in communication with a sound-sensing device 222, for example, a microphone, or any other sound-sensing device now existing or hereafter developed that can sense sounds near the computing device 200. The sound-sensing device 222 can be positioned such that it is directed toward the user operating the computing device 200 and can be configured to receive sounds, for example, speech or other utterances, made by the user while the user operates the computing device 200.

Although FIG. 2 depicts the processor 202 and the memory 204 of the computing device 200 as being integrated into a single unit, other configurations can be utilized. The operations of the processor 202 can be distributed across multiple machines (wherein individual machines can have one or more processors) that can be coupled directly or across a local area or other network. The memory 204 can be distributed across multiple machines such as a network-based memory or memory in multiple machines performing the operations of the computing device 200. Although depicted here as one bus, the bus 212 of the computing device 200 can be composed of multiple buses. Further, the secondary storage 214 can be directly coupled to the other components of the computing device 200 or can be accessed via a network and can comprise an integrated unit such as a memory card or multiple units such as multiple memory cards. The computing device 200 can thus be implemented in a wide variety of configurations.

Figure 3:
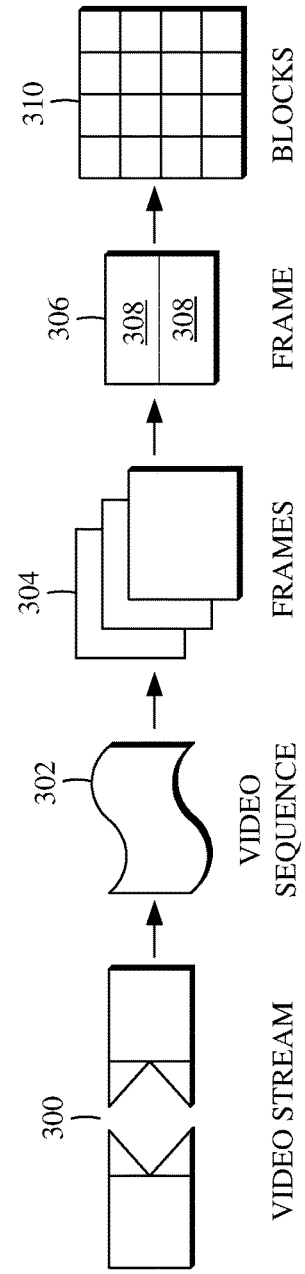
FIG. 3 is a diagram of an example of a video stream to be encoded and subsequently decoded.

FIG. 3 is a diagram of an example of a video stream 300 to be encoded and subsequently decoded. The video stream 300 includes a video sequence 302. At the next level, the video sequence 302 includes several adjacent frames 304. While three frames are depicted as the adjacent frames 304, the video sequence 302 can include any number of adjacent frames 304. The adjacent frames 304 can then be further subdivided into individual frames, for example, a frame 306. At the next level, the frame 306 can be divided into a series of planes or segments 308. The segments 308 can be subsets of frames that permit parallel processing, for example. The segments 308 can also be subsets of frames that can separate the video data into separate colors. For example, a frame 306 of color video data can include a luminance plane and two chrominance planes. The segments 308 may be sampled at different resolutions.

Whether or not the frame 306 is divided into segments 308, the frame 306 may be further subdivided into blocks 310, which can contain data corresponding to, for example, 16×16 pixels in the frame 306. The blocks 310 can also be arranged to include data from one or more segments 308 of pixel data. The blocks 310 can also be of any other suitable size such as 4×4 pixels, 8×8 pixels, 16×8 pixels, 8×16 pixels, 16×16 pixels, or larger. Unless otherwise noted, the terms block and macroblock are used interchangeably herein.

Figure 4:
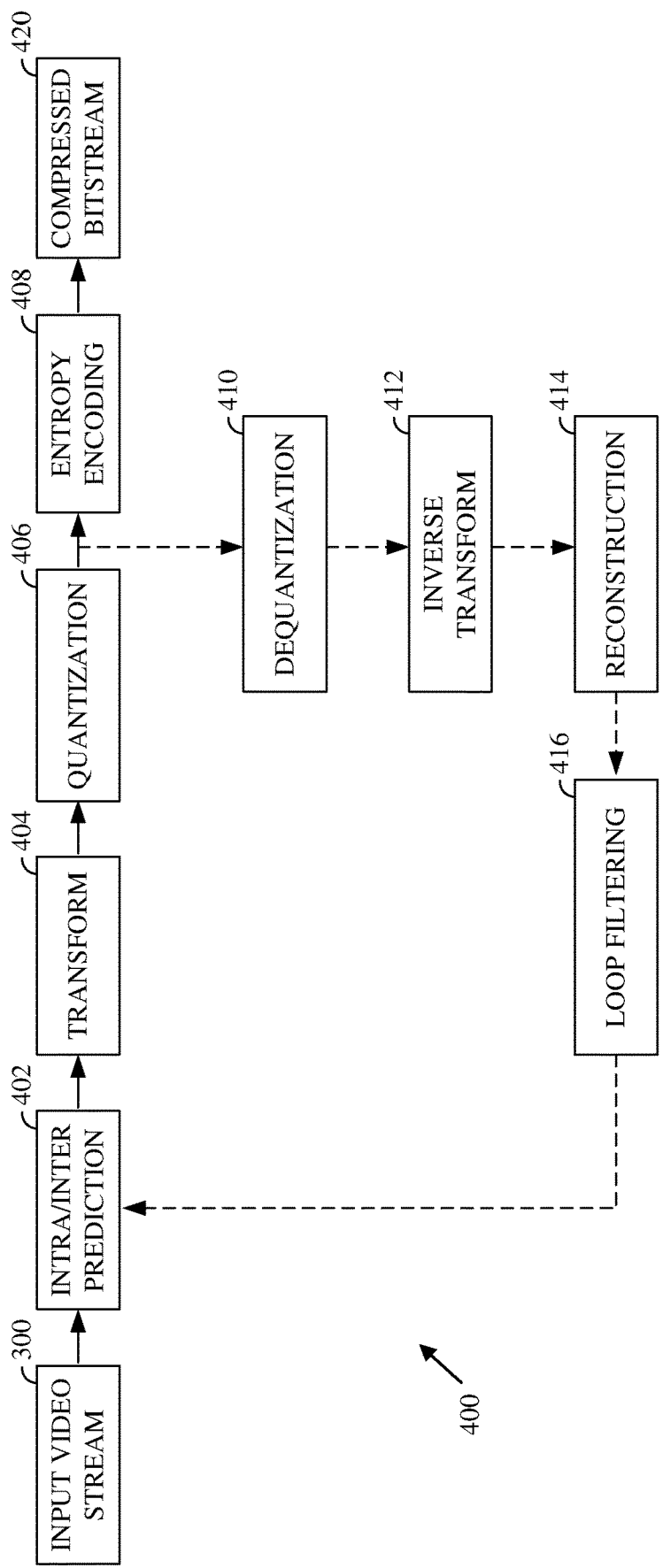
FIG. 4 is a block diagram of an example of an encoder.

FIG. 4 is a block diagram of an example of an encoder 400. The encoder 400 can be implemented, as described above, in the transmitting station 102, such as by providing a computer software program stored in memory, for example, the memory 204. The computer software program can include machine instructions that, when executed by a processor such as the processor 202, cause the transmitting station 102 to encode video data in the manner described in FIG. 4. The encoder 400 can also be implemented as specialized hardware included in, for example, the transmitting station 102. In one particularly desirable implementation, the encoder 400 is a hardware encoder.

The encoder 400 has the following stages to perform the various functions in a forward path (shown by the solid connection lines) to produce an encoded or compressed bitstream 420 using the video stream 300 as input: an intra/inter prediction stage 402, a transform stage 404, a quantization stage 406, and an entropy encoding stage 408. The encoder 400 may also include a reconstruction path (shown by the dotted connection lines) to reconstruct a frame for encoding of future blocks. In FIG. 4, the encoder 400 has the following stages to perform the various functions in the reconstruction path: a dequantization stage 410, an inverse transform stage 412, a reconstruction stage 414, and a loop filtering stage 416. Other structural variations of the encoder 400 can be used to encode the video stream 300.

When the video stream 300 is presented for encoding, respective adjacent frames 304, such as the frame 306, can be processed in units of blocks. At the intra/inter prediction stage 402, respective blocks can be encoded using intra-frame prediction (also called intra-prediction) or inter-frame prediction (also called inter-prediction). In any case, a prediction block can be formed. In the case of intra-prediction, a prediction block may be formed from samples in the current frame that have been previously encoded and reconstructed. In the case of inter-prediction, a prediction block may be formed from samples in one or more previously constructed reference frames.

Next, the prediction block can be subtracted from the current block at the intra/inter prediction stage 402 to produce a residual block (also called a residual). The transform stage 404 transforms the residual into transform coefficients in, for example, the frequency domain using block-based transforms. The quantization stage 406 converts the transform coefficients into discrete quantum values, which are referred to as quantized transform coefficients, using a quantizer value or a quantization level. For example, the transform coefficients may be divided by the quantizer value and truncated.

The quantized transform coefficients are then entropy encoded by the entropy encoding stage 408. The entropy-encoded coefficients, together with other information used to decode the block (which may include, for example, syntax elements such as used to indicate the type of prediction used, transform type, motion vectors, a quantizer value, or the like), are then output to the compressed bitstream 420. The compressed bitstream 420 can be formatted using various techniques, such as variable length coding (VLC) or arithmetic coding. The compressed bitstream 420 can also be referred to as an encoded video stream or encoded video bitstream, and the terms will be used interchangeably herein.

The reconstruction path (shown by the dotted connection lines) can be used to ensure that the encoder 400 and a decoder 500 (described below with respect to FIG. 5) use the same reference frames to decode the compressed bitstream 420. The reconstruction path performs functions that are similar to functions that take place during the decoding process (described below with respect to FIG. 5), including dequantizing the quantized transform coefficients at the dequantization stage 410 and inverse transforming the dequantized transform coefficients at the inverse transform stage 412 to produce a derivative residual block (also called a derivative residual). At the reconstruction stage 414, the prediction block that was predicted at the intra/inter prediction stage 402 can be added to the derivative residual to create a reconstructed block. The loop filtering stage 416 can be applied to the reconstructed block to reduce distortion such as blocking artifacts.

Other variations of the encoder 400 can be used to encode the compressed bitstream 420. In some implementations, a non-transform-based encoder can quantize the residual signal directly without the transform stage 404 for certain blocks or frames. In some implementations, an encoder can have the quantization stage 406 and the dequantization stage 410 combined in a common stage.

Figure 5:
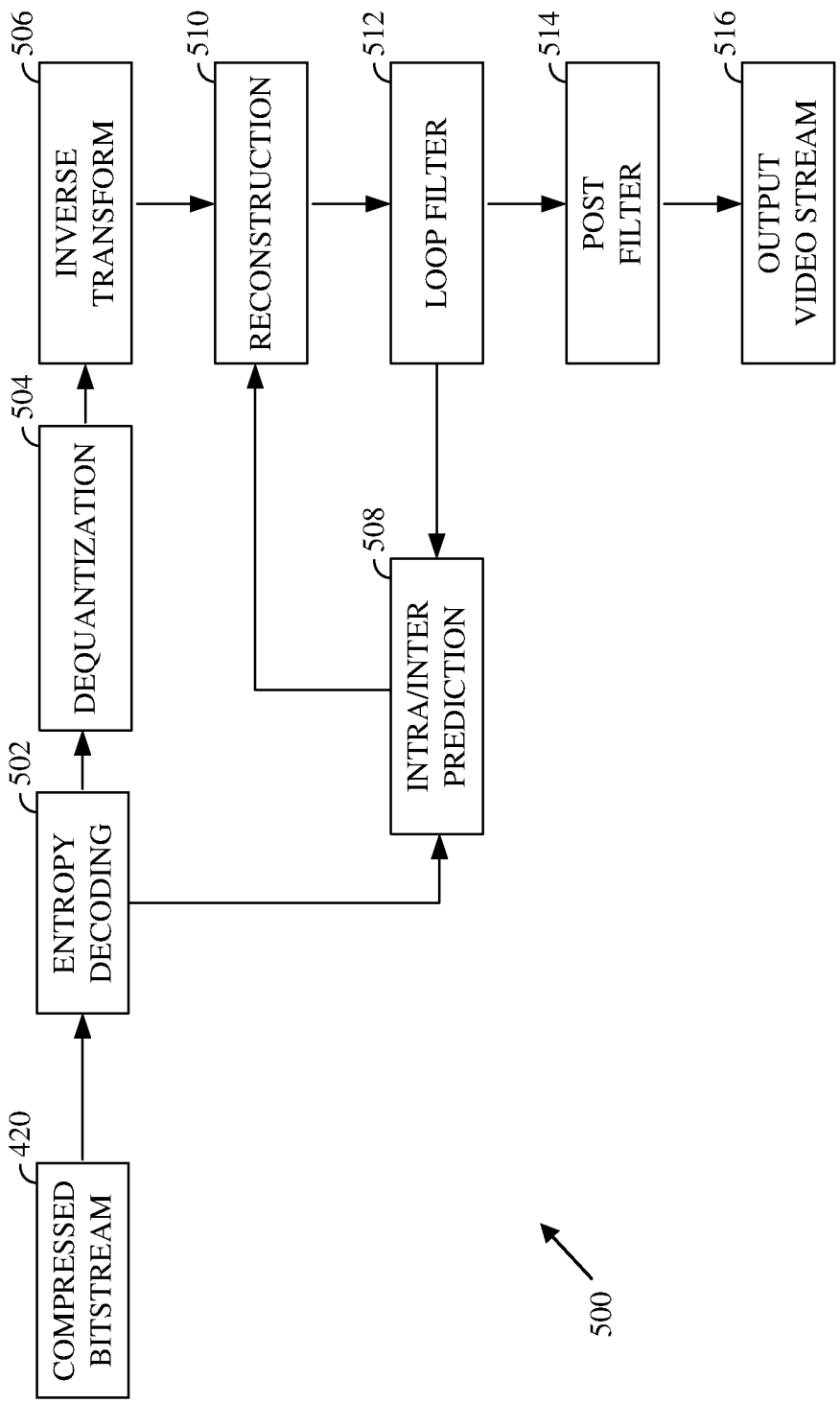
FIG. 5 is a block diagram of an example of a decoder.

FIG. 5 is a block diagram of an example of a decoder 500. The decoder 500 can be implemented in the receiving station 106, for example, by providing a computer software program stored in the memory 204. The computer software program can include machine instructions that, when executed by a processor such as the processor 202, cause the receiving station 106 to decode video data in the manner described in FIG. 5. The decoder 500 can also be implemented in hardware included in, for example, the transmitting station 102 or the receiving station 106.

The decoder 500, like the reconstruction path of the encoder 400 discussed above, includes in one example the following stages to perform various functions to produce an output video stream 516 from the compressed bitstream 420: an entropy decoding stage 502, a dequantization stage 504, an inverse transform stage 506, an intra/inter prediction stage 508, a reconstruction stage 510, a loop filtering stage 512, and a deblocking filtering stage 514. Other structural variations of the decoder 500 can be used to decode the compressed bitstream 420.

When the compressed bitstream 420 is presented for decoding, the data elements within the compressed bitstream 420 can be decoded by the entropy decoding stage 502 to produce a set of quantized transform coefficients. The dequantization stage 504 dequantizes the quantized transform coefficients (e.g., by multiplying the quantized transform coefficients by the quantizer value), and the inverse transform stage 506 inverse transforms the dequantized transform coefficients to produce a derivative residual that can be identical to that created by the inverse transform stage 412 in the encoder 400. Using header information decoded from the compressed bitstream 420, the decoder 500 can use the intra/inter prediction stage 508 to create the same prediction block as was created in the encoder 400 (e.g., at the intra/inter prediction stage 402).

At the reconstruction stage 510, the prediction block can be added to the derivative residual to create a reconstructed block. The loop filtering stage 512 can be applied to the reconstructed block to reduce blocking artifacts. Other filtering can be applied to the reconstructed block. In this example, the deblocking filtering stage 514 is applied to the reconstructed block to reduce blocking distortion, and the result is output as the output video stream 516. The output video stream 516 can also be referred to as a decoded video stream, and the terms will be used interchangeably herein. Other variations of the decoder 500 can be used to decode the compressed bitstream 420. In some implementations, the decoder 500 can produce the output video stream 516 without the deblocking filtering stage 514.

As can be discerned from the description of the encoder 400 and the decoder above, bits are generally used for one of two things in an encoded video bitstream: either content prediction (e.g., inter mode/motion vector coding, intra prediction mode coding, etc.) or residual or coefficient coding (e.g., transform coefficients). Encoders may use techniques to decrease the bits spent on coefficient coding. For example, a coefficient token tree (which may also be referred to as a binary token tree) specifies the scope of the value, with forward-adaptive probabilities for each branch in this token tree. The token base value is subtracted from the value to be coded to form a residual then the block is coded with fixed probabilities. A similar scheme with minor variations including backward-adaptivity is also possible. Adaptive techniques can alter the probability models as the video stream is being encoded to adapt to changing characteristics of the data. In any event, a decoder is informed of (or has available) the probability model used to encode an entropy-coded video bitstream in order to decode the video bitstream.

Figure 6:
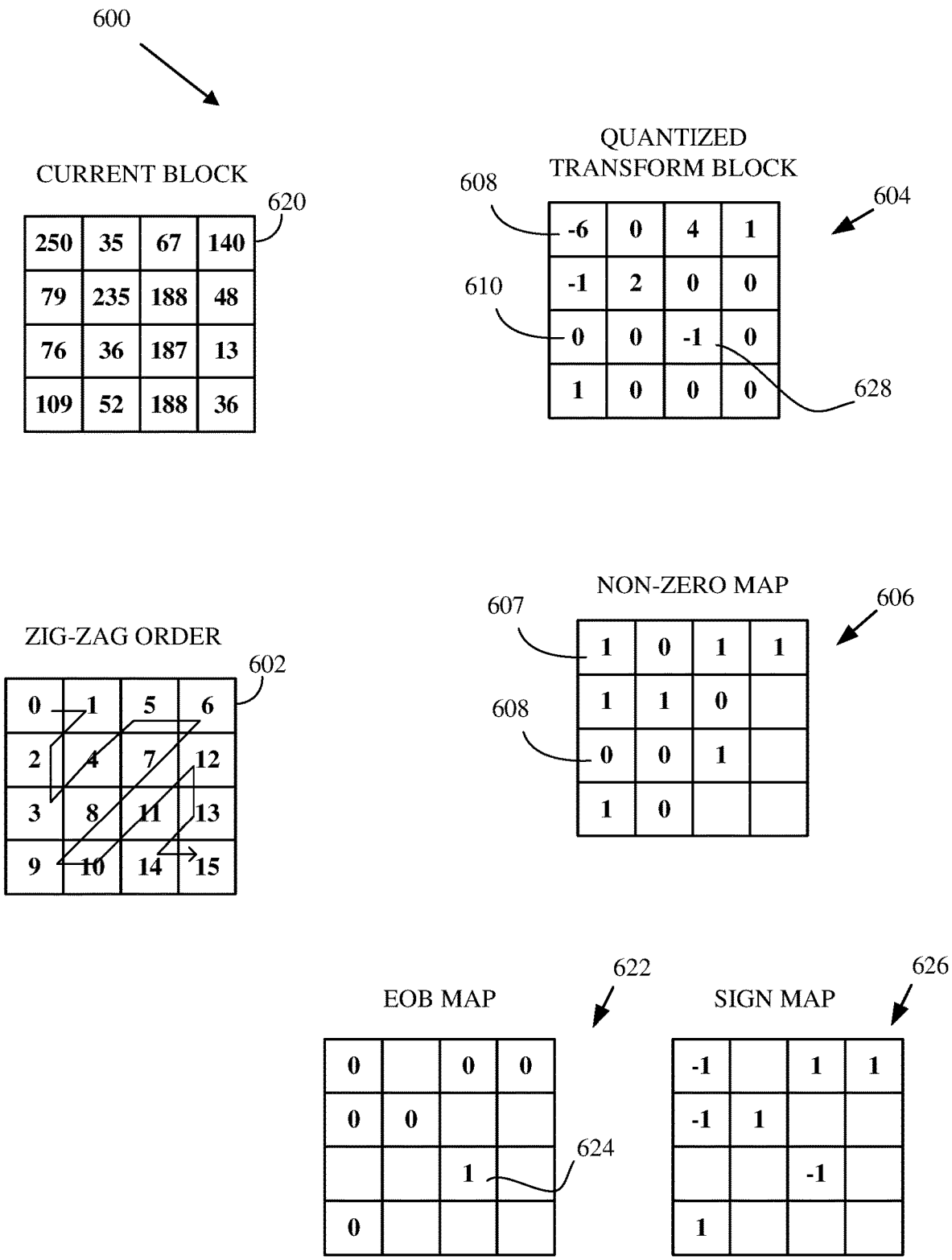
FIG. 6 is a diagram illustrating quantized transform coefficients according to implementations of this disclosure.

Before describing updating of the probability estimation for a sequence of symbols, the development of the sequence of symbols is described starting with FIG. 6.

FIG. 6 is a diagram 600 illustrating quantized transform coefficients according to implementations of this disclosure. The diagram 600 depicts a current block 620, a scan order 602, a quantized transform block 604, a non-zero map 606, an end-of-block map 622, and a sign map 626. The current block 620 is illustrated as a 4×4 block. However, any block size is possible. For example, the current block can have a size (i.e., dimensions) of 4×4, 8×8, 16×16, 32×32, or any other square or rectangular block size. The current block 620 can be a block of a current frame. In another example, the current frame may be partitioned into segments (such as the segments 308 of FIG. 3), tiles, or the like, each including a collection of blocks, where the current block is a block of the partition.

The quantized transform block 604 can be a block of a size similar to the size of the current block 620. The quantized transform block 604 includes non-zero coefficients (e.g., a coefficient 608) and zero coefficients (e.g., a coefficient 610). As described above, the quantized transform block 604 contains quantized transform coefficients for the residual block corresponding to the current block 620. Also as described above, the quantized transform coefficients are entropy coded by an entropy-coding phase, such as the entropy coding stage 408 of FIG. 4.

Entropy coding a quantized transform coefficient can involve the selection of a context model (also referred to as probability context model, probability model, model, and context) which provides estimates of conditional probabilities for coding the binary symbols of a binarized transform coefficient as described below with respect to FIG. 7. When entropy coding a quantized transform coefficient, additional information may be used as the context for selecting a context model. For example, the magnitudes of the previously coded transform coefficients can be used, at least partially, for determining a probability model.

To encode a transform block, a video coding system may traverse the transform block in a scan order and encode (e.g., entropy encode) the quantized transform coefficients as the quantized transform coefficients are respectively traversed (i.e., visited). In a zigzag scan order, such as the scan order 602, the top left corner of the transform block (also known as the DC coefficient) is first traversed and encoded, the next coefficient in the scan order (i.e., the transform coefficient corresponding to the location labeled "1") is traversed and encoded, and so on. In the zigzag scan order (i.e., scan order 602), some quantized transform coefficients above and to the left of a current quantized transform coefficient (e.g., a to-be-encoded transform coefficient) are traversed first. Other scan orders are possible. A one-dimensional structure (e.g., an array) of quantized transform coefficients can result from the traversal of the two-dimensional quantized transform block using the scan order.

In some examples, encoding the quantized transform block 604 can include determining the non-zero map 606, which indicates which quantized transform coefficients of the quantized transform block 604 are zero and which are non-zero. A non-zero coefficient and a zero coefficient can be indicated with values one (1) and zero (0), respectively, in the non-zero map. For example, the non-zero map 606 includes a non-zero 607 at Cartesian location (0, 0) corresponding to the coefficient 608 and a zero 608 at Cartesian location (2, 0) corresponding to the coefficient 610.

In some examples, encoding the quantized transform block 604 can include generating and encoding the end-of-block map 622. The end-of-block map indicates whether a non-zero quantized transform coefficient of the quantized transform block 604 is the last non-zero coefficient with respect to a given scan order. If a non-zero coefficient is not the last non-zero coefficient in the transform block, then it can be indicated with the binary bit zero (0) in the end-of-block map. If, on the other hand, a non-zero coefficient is the last non-zero coefficient in the transform block, then it can be indicated with the binary value one (1) in the end-of-block map. For example, as the quantized transform coefficient corresponding to the scan location 11 (i.e., the last non-zero quantized transform coefficient 628) is the last non-zero coefficient of the quantized transform block 604, it is indicated with the end-of-block value 624 of one (1); all other non-zero transform coefficients are indicated with a zero.

In some examples, encoding the quantized transform block 604 can include generating and encoding the sign map 626. The sign map 626 indicates which non-zero quantized transform coefficients of the quantized transform block 604 have positive values and which quantized transform coefficients have negative values. Transform coefficients that are zero need not be indicated in the sign map. The sign map 626 illustrates the sign map for the quantized transform block 604. In the sign map, negative quantized transform coefficients can be indicated with a −1 and positive quantized transform coefficients can be indicated with a one (1).

Figure 7:
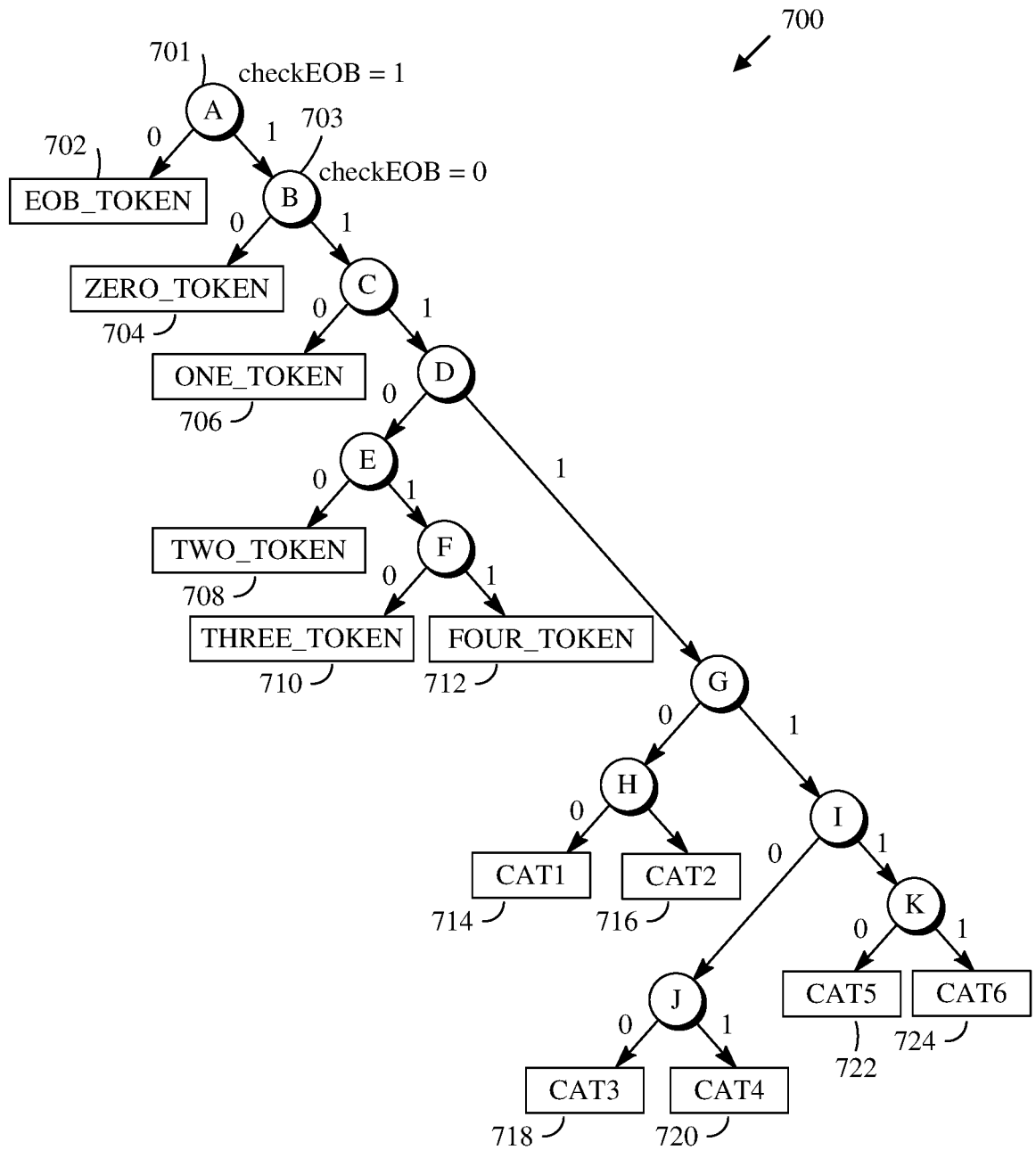
FIG. 7 is a diagram of a coefficient token tree that can be used to entropy code blocks into a video bitstream according to implementations of this disclosure.

FIG. 7 is a diagram of a coefficient token tree 700 that can be used to entropy code blocks into a video bitstream according to implementations of this disclosure. The coefficient token tree 700 is referred to as a binary tree because, at each node of the tree, one of two branches must be taken (i.e., traversed). The coefficient token tree 700 includes a root node 701 and a node 703 corresponding, respectively, to the nodes labeled A and B.

As described above with respect to FIG. 6, when an end-of-block (EOB) token is detected for a block, coding of coefficients in the current block can terminate and the remaining coefficients in the block can be inferred to be zero. As such, the coding of EOB positions can be an essential part of coefficient in a video coding system.

In some video coding systems, a binary decision determining whether (or not) a current token is equal to the EOB token of the current block is coded immediately after an nonzero coefficient is decoded or at the first scan position (DC). In an example, for a transform block of size M×N, where M denotes the number of columns and N denotes the number of rows in the transform block, the maximum number of times of coding whether a current token is equal to the EOB token is equal to M×N. M and N can take values, such as the values 2, 4, 8, 16, 32, and 64. As described below, the binary decision corresponds to the coding of a "1" bit corresponding to the decision to move from the root node 701 to the node 703 in the coefficient token tree 700. Herein, "coding a bit" can mean the outputting or generating of a bit in the codeword representing a transform coefficient being encoded. Similarly, "decoding a bit" can mean the reading (such as from an encoded bitstream) of a bit of the codeword corresponding to a quantized transform coefficient being decoded such that the bit corresponds to a branch being traversed in the coefficient token tree.

Using the coefficient token tree 700, a string of binary digits is generated for a quantized coefficient (e.g., the coefficients 608, 610 of FIG. 6) of the quantized transform block (such as the quantized transform block 604 of FIG. 6).

In an example, the quantized coefficients in an N×N block (e.g., quantized transform block 604) are organized into a 1D (one-dimensional) array (herein, an array u) following a prescribed scan order (e.g., the scan order 602 of FIG. 6). N can be 4, 8, 16, 32, or any other value. The quantized coefficient at the $i^{th}$ position of the 1D array can be referred as u[i], where i=0, . . . , N*N−1. The starting position of the last run of zeroes in u[i], . . . , u[N*N−1] can be denoted as eob. In the case where when u[N*N−1] is not zero, the eob can be set to the value N*N. That is, if the last coefficient of the 1D array u is not zero, then eob can be set to the value N*N. Using the examples of FIG. 6, the 1D array u can have the entries u[ ]=[−6, 0, −1, 0, 2, 4, 1, 0, 0, 1, 0, −1, 0, 0, 0, 0]. The values at each of the u[i]s is a quantized transform coefficient. The quantized transform coefficients of the 1D array u may also be referred herein simply as "coefficients" or "transform coefficients." The coefficient at position i=0 (i.e., u[0]=−6) corresponds to the DC coefficient. In this example, the eob is equal to 12 because there are no non-zero coefficients after the zero coefficient at position 12 of the 1D array u.

To encode and decode the coefficients u[i], . . . , u[N*N−1], for i=0 to N*N−1, a token t[i] is generated at each position i<=eob. The token t[i], for i<eob, can be indicative of the size and/or size range of the corresponding quantized transform coefficient at u[i]. The token for the quantized transform coefficient at eob can be an EOB_TOKEN, which is a token that indicates that the 1D array u contains no non-zero coefficients following the eob position (inclusive). That is, t[eob]=EOB_TOKEN indicates the EOB position of the current block. Table I below provides a listing of an example of token values, excluding the EOB_TOKEN, and their corresponding names according to an implementation of this disclosure.

TABLE I

| Token | Name of Token |
|---|---|
| 0 | ZERO_TOKEN |
| 1 | ONE_TOKEN |
| 2 | TWO_TOKEN |
| 3 | THREE_TOKEN |
| 4 | FOUR_TOKEN |
| 5 | DCT_VAL_CAT1 (5, 6) |
| 6 | DCT_VAL_CAT2 (7-10) |
| 7 | DCT_VAL_CAT3 (11-18) |
| 8 | DCT_VAL_CAT4 (19-34) |
| 9 | DCT_VAL_CAT5 (35-66) |
| 10 | DCT_VAL_CAT6 (67-2048) |

In an example, quantized coefficient values are taken to be signed 12-bit integers. To represent a quantized coefficient value, the range of 12-bit signed values can be divided into 11 tokens (the tokens 0-10 in Table I) plus the end of block token (EOB_TOKEN). To generate a token to represent a quantized coefficient value, the coefficient token tree 700 can be traversed. The result (i.e., the bit string) of traversing the tree can then be encoded into a bitstream (such as the bitstream 420 of FIG. 4) by an encoder as described with respect to the entropy encoding stage 408 of FIG. 4.

The coefficient token tree 700 includes the tokens EOB_TOKEN (token 702), ZERO_TOKEN (token 704), ONE_TOKEN (token 706), TWO_TOKEN (token 708), THREE_TOKEN (token 710), FOUR_TOKEN (token 712), CAT1 (token 714 that is DCT_VAL_CAT1 in Table I), CAT2 (token 716 that is DCT_VAL_CAT2 in Table I), CAT3 (token 718 that is DCT_VAL_CAT3 in Table I), CAT4 (token 720 that is DCT_VAL_CAT4 in Table I), CAT5 (token 722 that is DCT_VAL_CAT5 in Table I) and CAT6 (token 724 that is DCT_VAL_CAT6 in Table I). As can be seen, the coefficient token tree maps a single quantized coefficient value into a single token, such as one of the tokens 704, 706, 708, 710 and 712. Other tokens, such as the tokens 714, 716, 718, 720, 722 and 724, represent ranges of quantized coefficient values. For example, a quantized transform coefficient with a value of 37 can be represented by the token DCT_VAL_CAT5—the token 722 in FIG. 7.

The base value for a token is defined as the smallest number in its range. For example, the base value for the token 720 is 19. Entropy coding identifies a token for each quantized coefficient and, if the token represents a range, can form a residual by subtracting the base value from the quantized coefficient. For example, a quantized transform coefficient with a value of 20 can be represented by including the token 720 and a residual value of 1 (i.e., 20 minus 19) in the encoded video bitstream to permit a decoder to reconstruct the original quantized transform coefficient. The end of block token (i.e., the token 702) signals that no further non-zero quantized coefficients remain in the transformed block data.

To encode or decode a token t[i] by using a binary arithmetic coding engine (such as by the entropy encoding stage 408 of FIG. 4), the coefficient token tree 700 can be used. The coefficient token tree 700 is traversed starting at the root node 701 (i.e., the node labeled A). Traversing the coefficient token tree generates a bit string (a codeword) that will be encoded into the bitstream using, for example, binary arithmetic coding. The bit string is a representation of the current coefficient (i.e., the quantized transform coefficient being encoded).

If a current coefficient is zero, and there are no more non-zero values for the remaining transform coefficients, the token 702 (i.e., the EOB_TOKEN) is added into the bitstream. This is the case, for example, for the transform coefficient at scan order position 12 of FIG. 6. On the other hand, if the current coefficient is non-zero, or if there are non-zero values among any remaining coefficients of the current block, a "1" bit is added to the codeword and traversal passes to the node 703 (i.e., the node labeled B). At node B, the current coefficient is tested to see if it is equal to zero. If so, the left-hand branch is taken such that token 704 representing the value ZERO_TOKEN and a bit "0" is added to the codeword. If not, a bit "1" is added to the codeword and traversal passes to node C. At node C, the current coefficient is tested to see if it is greater than 1. If the current coefficient is equal to one (1), the left-hand branch is taken and token 706 representing the value ONE_TOKEN is added to the bitstream (i.e., a "0" bit is added to the codeword). If the current coefficient is greater than one (1), traversal passes to node D to check the value of the current coefficient as compared to the value 4. If the current coefficient is less than or equal to 4, traversal passes to node E and a "0" bit is added to the codeword. At node E, a test for equality to the value "2" may be made. If true, token 706 representing the value "2" is added to the bitstream (i.e., a bit "0" is added to the codeword). Otherwise, at node F, the current coefficient is tested against either the value "3" or the value "4" and either token 710 (i.e., bit "0" is added to the codeword) or token 712 (i.e., bit "1" is added to the codeword) to the bitstream as appropriate; and so on.

In brief, a "0" bit is added to the codeword upon traversal to a left child node and a "1" bit is added to the codeword upon traversal to a right child node. A similar process is undertaken by a decoder when decoding a codeword from a compressed bitstream. The decoder reads a bit from bit stream. If the bit is a "1," the coefficient token tree is traversed to the right and if the bit is a "0," the tree is traversed to the left. The decoder reads then a next bit and repeats the process until traversal of the tree reaches a leaf node (i.e., a token). As an example, to encode a token t[i]=THREE_TOKEN, starting from the root node (i.e., the root node 701), a binary string of 111010 is encoded. As another example, decoding the codeword 11100 results in the token TWO_TOKEN.

Note that the correspondence between "0" and "1" bits to left and right child nodes is merely a convention used to describe the encoding and decoding processes. In some implementations, a different convention, for example, in one where "1" corresponds to the left child node, and "0" corresponds to the right child node, can be used. As long as both the encoder and the decoder adopt the same convention, the processes described herein can be applied.

Since an EOB_TOKEN is only possible after a nonzero coefficient, when u[i−1] is zero (that is, when the quantized transform coefficient at location i−1 of the 1D array u is equal to zero), a decoder can infer that the first bit must be 1. The first bit has to be 1 since, in traversing the tree, for a transform coefficient (e.g., transform coefficient at the zigzag scan order location 2 of FIG. 6) following a zero transform coefficient (e.g., transform coefficient at the zigzag scan order location 1 of FIG. 6), the traversal necessarily moves from the root node 701 to the node 703.

As such, a binary flag checkEob can be used to instruct the encoder and the decoder to skip encoding and decoding the first bit leading from the root node in the coefficient token tree 700. In effect, when the binary flag checkEob is 0 (i.e., indicating that the root node should not be checked), the root node 701 of the coefficient token tree 700 is skipped and the node 703 becomes the first node of coefficient token tree 700 to be visited for traversal. That is, when the root node 701 is skipped, the encoder can skip encoding and the decoder can skip decoding and can infer a first bit (i.e., a binary bit "1") of the encoded string.

At the start of encoding or decoding a block, the binary flag checkEob can be initialized to 1 (i.e., indicating that the root node should be checked). The following steps illustrate an example process for decoding quantized transform coefficients in an N×N block.

At step 1, the binary flag checkEob is set to zero (i.e., checkEob=0) and an index i is also set to zero (i.e., i=0).

At step 2, a token t[i] is decoded by using either (1) the full coefficient token tree (i.e., starting at the root node 701 of the coefficient token tree 700) if the binary flag checkEob is equal to 1; or (2) using the partial tree (e.g., starting at the node 703) where the EOB_TOKEN is skipped, if checkEob is equal to 0.

At step 3, If the token t[i]=EOB_TOKEN, then the quantized transform coefficients u[i], . . . , u[N*N— 1] are all to zero and the decoding process terminates; otherwise, extra bits can be decoded if necessary (i.e., when t[i] is not equal to the ZERO_TOKEN) and reconstruct u[i].

At step 4, the binary flag checkEob is set to 1 if u[i] is equal to zero, otherwise checkEob is set to 0. That is, checkEob can be set to the value (u[i]!=0).

At step 5, the index i is incremented (i.e., i=i+1).

At step 6, the steps 2-5 are repeated until all quantized transform coefficients have been decoded (i.e., until the index i=N*N) or until the EOB_TOKEN is decoded.

At step 2 above, decoding a token t[i] can include the steps of determining a context ctx, determining a binary probability distribution (i.e., a model) from the context ctx, and using a boolean arithmetic code to decode a path from the root node of the coefficient token tree 700 to a leaf node by using the determined probability distributions. The context ctx can be determined using a method of context derivation. The method of context derivation can use one or more of the block size, plane type (i.e., luminance or chrominance), the position i, and previously decoded tokens t[0], . . . , t[i−1] to determine the context ctx. Other criteria can be used to determine the context ctx. The binary probability distribution can be determined for any internal node of the coefficient token tree 700 starting from the root node 701 when checkEOB=1 or from the node 703 when checkEOB=0.

In some coding systems, the probability used to encode or decode a token t[i] given a context ctx may be fixed and does not adapt in a picture (i.e., a frame). For example, the probability may be either a default value that is defined for the given context ctx or the probability may be coded (i.e., signaled) as part of the frame header for that frame. Coding the probability for every context in coding a frame can be costly. As such, an encoder may analyze, for each context, whether it is beneficial to code the context's associated probability in the frame header and signal its decision to the decoder by using a binary flag. Furthermore, coding the probability for a context may use prediction to reduce cost (e.g., in bit rate) where the prediction may be derived from the probability of the same context in a previously decoded frame.

In some coding systems, instead of traversing a coefficient token tree, such as the coefficient token tree 700, to code a transform coefficient, each token can be associated with a value that is coded. As such, instead of coding binary symbols (i.e., selected from an alphabet comprised of the symbols {0, 1}), an alphabet of symbols that includes more than two symbols is used for coding transform coefficients. In an example, the alphabet includes 12 symbols, namely {EOB_TOKEN, ZERO_TOKEN, ONE_TOKEN, TWO_TOKEN, THREE_TOKEN, FOUR_TOKEN, DCT_VAL_CAT1, DCT_VAL_CAT2, DCT_VAL_CAT3, DCT_VAL_CAT4, DCT_VAL_CAT5, DCT_VAL_CAT6}. As such, the alphabet for coding transform coefficients includes 12 symbols, which are also referred to as tokens. Other token alphabets that include more, fewer, or different tokens are possible. An alphabet that includes only the symbols {0, 1} is referred to herein as a binary alphabet. An alphabet that includes symbols other than and/or in addition to the symbols {0, 1} is referred to herein as a non-binary alphabet. Each of the tokens can be associated with a value. In an example, the EOB_TOKEN can have a value of 255. Each of the other tokens can each be associated with a different value.

Figure 8:
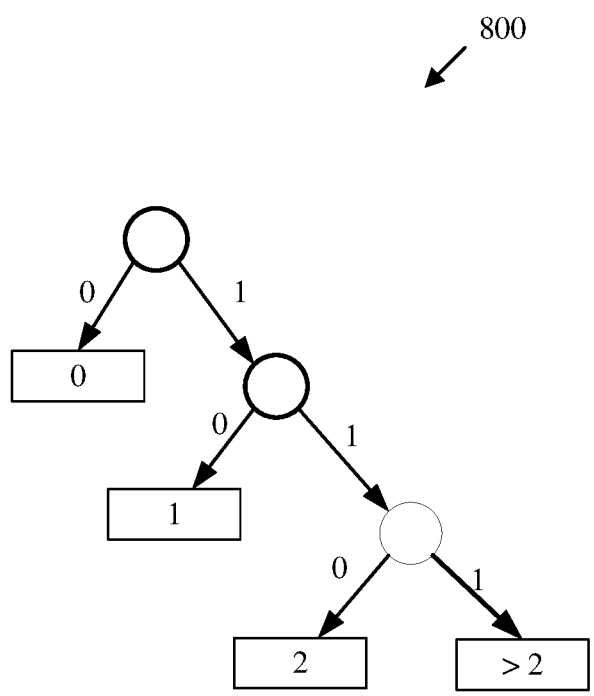
FIG. 8 is a diagram of an example of a tree for binarizing a quantized transform coefficient according to implementations of this disclosure.

FIG. 8 is a diagram of an example of a tree 800 for binarizing a quantized transform coefficient according to implementations of this disclosure. The tree 800 is a binary tree that can be used for binarizing quantized transform coefficients in some video coding systems. The tree 800 can be used by a video coding system that uses the steps of binarization, context modelling, and binary arithmetic coding for encoding and decoding of quantized transform coefficients. The process may be referred to as context-adaptive binary arithmetic coding (CABAC). For example, to code a quantized transform coefficient x, the coding system may perform the following steps. The quantized transform coefficient x can be any of the coefficients (e.g., the coefficient 608) of the quantized transform block 604 of FIG. 6.

In the binarization step, a coefficient x is first binarized into a binary string by using the tree 800. The binarization process may binarize the unsigned value of the coefficient x. For example, binarizing the coefficient 628 (i.e., the value −1), binarizes the value 1. This results in traversing the tree 800 and generating the binary string 10. Each of the bits of the binary string 10 is referred to as a bin.

In the context derivation step, for each bin to be coded, a context is derived. A context can be derived from information such as one or more of the block size, plane type (i.e., luminance or chrominance), block position of the coefficient x, and previously decoded coefficients (e.g., a left and/or above neighboring coefficients, if available). Other information can be used to derive the context.

In the binary arithmetic coding step, given a context, a bin is coded by using, e.g., a binary arithmetic coding engine into a binary codeword together with a probability value associated with the context.

The steps of coding a transform coefficient can include a step that is referred as context update. In the context update step, after a bin is coded, the probability associated with the context is updated to reflect the value of the bin.

As described briefly above, entropy coding a sequence of symbols may be achieved by using a probability model to determine a probability p for the sequence. Then, binary arithmetic coding may be used to map the sequence to a binary codeword at the encoder and to decode that sequence from the binary codeword at the decoder. The length (i.e., number of bits) of the codeword or string is given by equation (2) above. As the length is an integer number, however, the length is the smallest integer that is greater than the value calculated by equation (2). The efficiency of entropy coding can be directly related to the probability model.

In the following description, when referring to a sequence s of N symbols, a subscript of t refers to the symbol at position t in the sequence. For example, where s is a sequence of five (5) binary symbols, such as 11010, $s_5$ refers to the symbol in the $5^{th}$ position, such as the last 0 in the sequence 11010. As such the sequence s can be expressed as $s_1, s_2, \ldots, s_N$.

In some implementations, a symbol can refer to a token that is selected from a non-binary token alphabet that includes more than two tokens. As such, the symbol (i.e., token) can have one of the available values. The token can be a token that is used to code, and is indicative of, a transform coefficient. In such cases, "a sequence of symbols s" refers to the list of tokens $s_1, s_2, \ldots, s_N$ used to code the transform coefficients at scan positions $1, 2, \ldots, N$, respectively, in a scan order.

As used herein, probability values, such as the probability $\hat{p}_t(s_t)$ of a current symbol $s_t$, can have either floating-point or fixed-point representations. Accordingly, operations applied to these values may use either floating-point arithmetic or fixed-point arithmetic.

Given two estimated probabilities for the same symbol $\hat{p}_{t1}(s_t)$ and $\hat{p}_{t2}(s_t)$ such that $\hat{p}_{t1}(s_t) < \hat{p}_{t2}(s_t)$, the probability $\hat{p}_{t2}(s_t)$ results in a codeword that is no shorter than the probability $\hat{p}_{t1}(s_t)$. That is, a smaller probability typically produces a longer codeword than a larger probability.

A probability estimation model, which is a first-order linear system, is derived generally from equation (3) below, which estimates the probabilities that a symbol at t+1 is either 0 or 1 based on a weighted combination of the probabilities for the prior symbol at t and a conditional probability. The weighted combination uses a fixed weight or a variable weight as described below.

$$\begin{bmatrix} \hat{p}(0) \\ \hat{p}(1) \end{bmatrix}_{t+1} = \alpha \begin{bmatrix} \hat{p}(0) \\ \hat{p}(1) \end{bmatrix}_t + (1-\alpha) \cdot \begin{cases} \begin{bmatrix} 1 \\ 0 \end{bmatrix}, s = 0 \\ \begin{bmatrix} 0 \\ 1 \end{bmatrix}, s = 1 \end{cases} \quad (3)$$

This estimate is based on part on understanding that, where $p_t \in \mathbb{R}^2$ (i.e., a vector with two elements) is denoted as the probability estimation at time t (i.e., t represents the index of the current symbol), the equation $\hat{p}_t(0) + \hat{p}_t(1) = 1$ is true where $\hat{p}_t(0)$ and $\hat{p}_t(1)$ are probabilities of the current symbol at t being 0 and 1. The value α may depend upon the particular codec used for the encoding and decoding operations. For example, the probability model may be from the probability estimation module in the CABAC framework used in H.264/AVC, such as described in Section III.C. of D. Marpe et al., "Context-based adaptive binary arithmetic coding in the H. 264/AVC video compression standard," IEEE Transactions on Circuits and Systems for Video Technology, Vol. 13, No. 7, pp. 620-636 (2003). In such an example, the value α is a constant of almost 0.95. In another example, the probability model may be from the probability estimation module in AV1, such as described in P. de Rivaz and J. Haughton, "AV1 bitstream & decoding process specification," The Alliance for Open Media, p. 182 (2018) or Y. Chen et al., "An overview of core coding tools in the AV1 video codec," in 2018 Picture Coding Symposium (PCS), IEEE, pp. 41-45 (2018). In this example, the probability update would use an adaptive a in terms of time (i.e., current symbol index) and number of symbols. In either example, there may be a barrier value $p_{barrier}$ such that if $\hat{p}(0)$ or $\hat{p}(1)$ is too small (i.e., is too close to 0 or 1 as indicated by a defined criteria), the value α is raised to $p_{barrier}$. Stated more simply, $p_{barrier}$ prevents the probability estimation from being equal to 0. In certain examples herein, $p_{barrier}$ is referred to as $p_{62}$.

Equation (3) is considered an update rule that corresponds to a linear dynamic system that is used for prediction of sequential data. It is a first-order linear system that may be even more generalized to be written as equation (4) below, where the observed outcome u of the random system at time t is treated as an input.

$$p_{t+1} = \alpha p_t + (1-\alpha) u \quad (4)$$

If another model in combination (e.g., generating the observed outcome u), the probability estimation model used for entropy coding may instead correspond to a higher-order linear system that produces more accurate results (e.g., lower entropy). In a possible technique, a probability model may include an update algorithm that uses conditions other than those of a baseline probability model in its update rule. For example, instead of using $\hat{p}(s_t)$, an estimate of the conditional probability over r symbols $\hat{p}(s_t s_{t-1} \ldots s_{t-r})$ may be used. In this estimation, a list may be used to apply multiple probability updates. In a possible technique, a weighted average of models may be used to create a higher-order linear system. In a possible technique, update rates may be self-adaptive as described in more detail below.

Each of these techniques may be used separately or in combination for the probability estimation, that is, to entropy code a sequence of symbols. In the examples described below, the sequence of symbols input into the entropy coding and update algorithm may comprise a sequence s of N symbols. The sequence may correspond to the binarization of symbols representing any portion of a frame, such as the frame, a segment, a slice, a block, or some other portion of the frame, such as the data described with regards to FIGS. 6-8.

Figure 9:
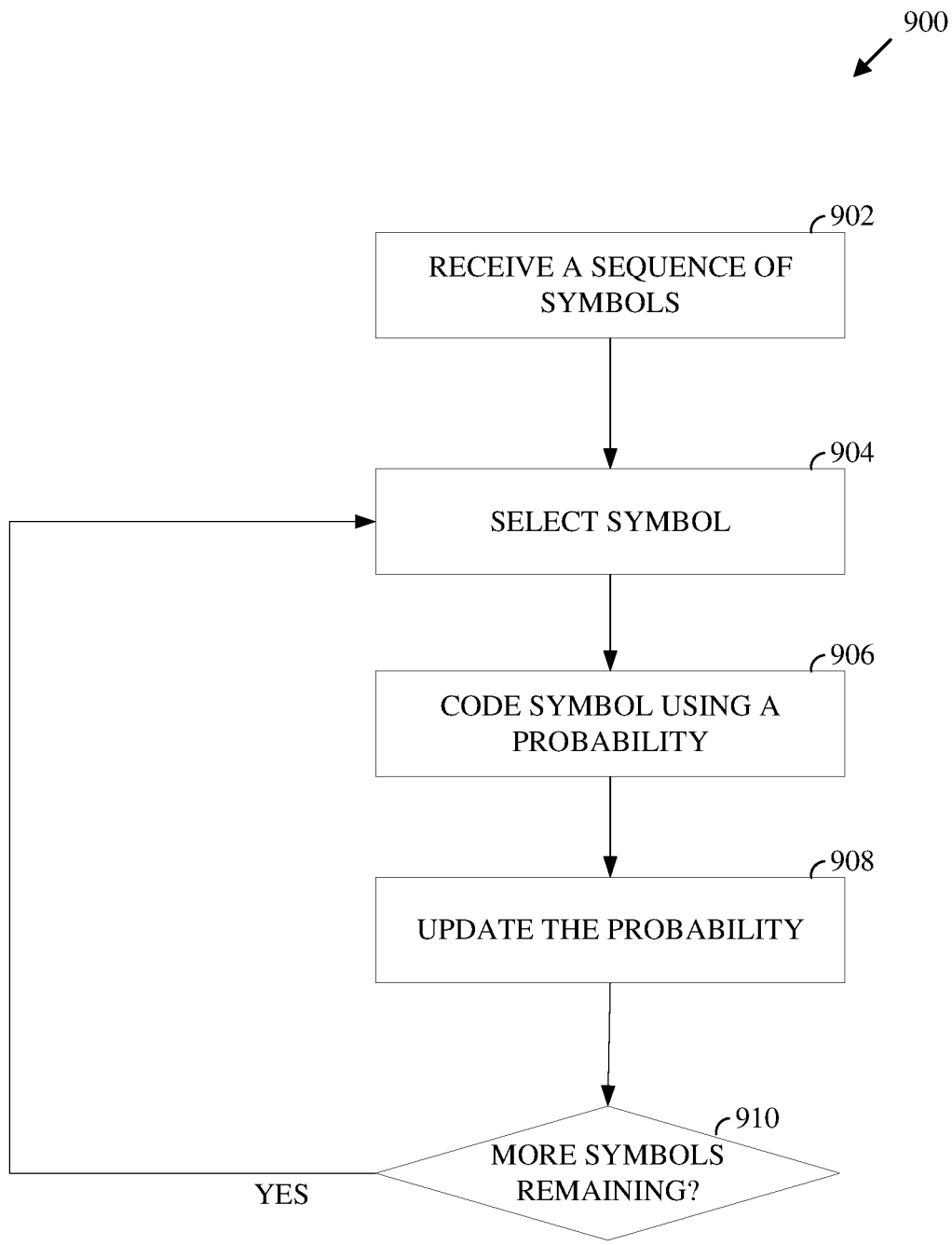
FIG. 9 is a flow chart of a method for entropy coding a sequence of symbols according to the teachings herein.

FIG. 9 is a flow chart of a method 900 for entropy coding a sequence of symbols according to the teachings herein. At 902, a sequence of symbols is received. In the examples herein, the sequence is a sequence s of N binary symbols, where $s \in \{0,1\}^N$, is entropy coded. The next step is to select a symbol at 904. For example, the current symbol may be a first symbol in the sequence. At 906, the current symbol is entropy coded using a probability. In some implementations, the probability may be the probability determined by a first, or baseline, probability model of a plurality of probability models. In other implementations, the probability may be an updated probability that uses a combination of estimations of the probability determined using respective probability models. In either event, the probability for the next symbol may be updated at 908. The probability of the baseline and any other probability models may be updated, and a combination of these estimations may be used to update the probability at 908. The combination is a second-order linear system different from each of the first-order linear systems represented by the models. This method 900 proceeds to check for remaining symbols at 910 and repeats until no symbols remain to be entropy coded.

The method 900 is next described with certain examples. First described is an implementation where a fixed probability estimation is used to update the probability for entropy coding symbols of the sequence. The first example is followed by a second example that uses an adaptive probability estimation.

Parameters or variables used for the entropy coding and probability of estimation are defined, initialized, or otherwise determined, either before, after, or concurrent with receipt of the sequence at 902. Because this example uses binary symbols, probability values may be initialized so that the probability that the current symbol is 0 or is 1 is $\hat{p}_{inf} = \hat{p}_{CABAC} = p = [0.5, 0.5]$. That is, the probability that the first symbol is 0 or is 1 is set to be equal at the start of the sequence s. In this example, multiple probability models may be available for probability estimation, while two are shown. The probability p is used to entropy code the current symbol, the probability $\hat{p}_{inf}$ is a first probability estimate from a first probability model based on counting as described below, and the probability $\hat{p}_{CABAC}$ is a second probability estimation from a second probability model based on $\hat{p}_{CABAC}$. A parameter mode is selected from the set comprising 0 and 1 (mode $\in \{0,1\}$). The parameter mode indicates which of the first probability model or the second probability model is a baseline model. In an example described herein, mode=0 such that the baseline model comprises a CABAC model.

A weight w used to combine the probability estimate of the first probability model with a conditional probability is set to a value of 0.5 in this fixed probability estimation, but a variable or adaptive weighting can be used in other examples of the teachings herein. For reasons described in additional detail below, a variable r and a variable $t_{thres}$ are set. For binary entropy coding, the variable r is set to 5, but the variable r may be equal to a different value. For example, when performing multi-symbol entropy coding, the variable r may be set equal to 8. One use of the variable r is to define the size L of a list for storing probability values, which list is used to determine the conditional probability. Entries of probability values within the list are initialized as follows: List=$[[0,0]]^L$, where $L=2^\tau$. The variable $t_{thres}$, also described below, is set equal to 25, but it could be set to a lower or higher value.

The value $\alpha$ described with regards to equations (3) and (4) may depend upon the particular codec used for the encoding and decoding operations as described above. In some examples, the value $\alpha$ may be a constant or may be adaptive in terms of time and number of symbols. In the following example, the value $\alpha$ is fixed such that $\alpha = (0.01875/0.5)^{1/63}$ (approximately equal to 0.95), which is consistent with the CABAC model. As mentioned above, a barrier value $p_{barrier}$ (also referred to as $p_{62}$) may be used to limit p to a minimum value. In this example, $p_{62} = 0.5\alpha^{62}$.

The index (time) t is initialized to 1 to indicate that processing starts with the first symbol $s_1$ in the sequence. While t remains less than or equal to the total number of symbols N, the processing receives the symbol $s_t$, codes the symbol $s_t$ by p, which may also be described herein as $\hat{p}_t$ or $\hat{p}$, and then updates the probability as described below. The index t is updated to proceed to the next symbol $s_{t+1}$ in the sequence, if any. The symbol $s_{t+1}$ is entropy coded by the updated probability p. This process continues until all symbols in the sequence s are entropy coded (i.e., entropy encoded or entropy decoded).

Pseudocode that represents this outer loop of the entropy coding and probability estimation is shown below.

```
while t < N do
  Receive symbol s_t.
  Entropy code s_t by p.
  p, p̂_inf, p̂_CABAC, List ←
    ProbUpdate(p̂_inf, p̂_CABAC, τ, s_{t-τ}: s_t, t, w, t_thres, List, mode).
  t ← t + 1
end while
```

As can be seen from the above pseudocode, the function ProbUpdate is called after $s_t$ is entropy coded. The function ProbUpdate receives as input the probability $p_{inf}$, the probability $\hat{p}_{CABAC}$, the parameter $\tau$, the values of the symbols in the range $s_{t-\tau}$ to $s_t$, the index t of the current symbol $s_t$, the weight w, the variable $t_{thres}$, List, and the parameter mode. The function ProbUpdate returns the probability p, the probability $p_{inf}$, the probability $\hat{p}_{CABAC}$, and the entries in the List. More generally, the function ProbUpdate updates the probability p for coding the next symbol in the sequence of symbols.

In an implementation of the teachings herein, the probability estimate updates may incorporate two probability estimation models—the CABAC model previously described (and represented by $\hat{p}_{CABAC}$) as well as the maximum likelihood estimate (MLE) for an independent identical distribution (i.i.d) sequence of symbols based on counting (represented by $\hat{p}_{inf}$). The MLE for i.i.d sequence may be explained using a binary sequence for simplicity. Assume $s_1 \ldots s_t$ is i.i.d Bernoulli (i.e., a Bernoulli distribution) where 0 happens with probability p, and there is no preference of p, i.e., the prior of p is U[0, 1]. From observation of the sequence, if 0 occurs k times and 1 occurs l times, the estimator that satisfies equation (5) below $$\underset{\hat{p}}{\arg\min} - E_p(p\log(\hat{p}) + (1 - p)\log(1 - \hat{p})) \qquad (5)$$

corresponds to equation (6) below for the estimated probability $\hat{p}$.

$$\hat{p} = \frac{k+1}{k+l+2} \qquad (6)$$

These models, and the others herein, may be referred to as a first probability model, a second probability model, a third probability model, etc., to distinguish one from another without any regard to the sequence of performance. Whether mode indicates that the baseline model is the CABAC model or the MLE model, an updated probability may be determined using an estimate of conditional probability $\hat{p}(s_t | s_{t-1} \ldots s_{t-\tau})$ over the previous symbols. To obtain the estimate of conditional probability $p_{cond}$, the List is used with an adjustable size $2^\tau$ that stores all possible context sequences $s_{t-1}:s_{t-\tau}$. The List functions as a hashtable for conditions to store the conditional probability. When a symbol arrives, its previous $\tau$ symbols are taken as the context. Then, the corresponding context in the list is accessed, and the count is updated. The probability estimation is the frequency. Until the number of symbols coded is greater than $\tau$ (i.e., t>$\tau$), the baseline estimation ($\hat{p}_{inf}$ or $\hat{p}_{CABAC}$) may be output as the probability p.

When the corresponding list item has too few counts, the estimation may not be accurate. There are at least two possible solutions. First, the condition has the length $\tau$ (which, as described above, varies with the number of symbols). When the list item has few counts, the history of shorter lengths $\tau-1$, $\tau-2$, etc., may be considered. This involves taking unions of counts in multiple dictionary items. Whenever the count over this union reaches the threshold $t_{thres}$, this probability estimation is recorded. For example, this may result in merging 00000 and 00001 as 0000. Second, if the total list is not large enough, the baseline estimation ($\hat{p}_{inf}$ or $\hat{p}_{CABAC}$) may be output as the probability p.

The mode input mode lets a user decide whether to use a function ProbUpdateCABAC (corresponding to the CABAC model) or ProbUpdateCount (corresponding to the MLE model) to produce the baseline probability estimation and take its average (because weight w=0.5) with the conditional probability estimation ($p_{cond}$) to provide a stable version of an output. Taking the average is non-trivial compared to changing an update rate (analogous to a in CABAC). This is because an average of two fixed rate update algorithms results in a second-order linear dynamic essentially different from a first-order update.

That is, referring back to equation (4), a weighted average of probability update may be considered as follows.

$$q_{t+1} = aq_t + (1-a)u_t$$

$$r_{t+i} = ar_t + (1-b)u_t$$

$$p_t = wq_t + (1-w)r_t$$

Substituting in equation (4) and solving by canceling q and r results in equation (7) below, which is a second order system that covers CABAC when a=b=0.95.

$$p_{t+1} = (a+b)p_t - abp_{t-1} + (w(1-a) + (1-w)(1-b))u_t + (ab-(1-w)a-wb)u_{t-1} \quad (7)$$

This second order system cannot be trivially reduced to a first order system only involving $p_{t+1}$, $p_t$, and $u_t$.

The probability update described above used a fixed (e.g., a linear) combination of update algorithms for context-based probability estimation. One example of a function ProbUpdate that implements the second order system described above is shown by the following pseudocode. In brief, when the function ProbUpdate is called after $s_t$ is entropy coded by p in the outer loop, the probability estimation models available as the baseline model are used to generate a respective estimated probability.

```
DefProbUpdate($\hat{p}_{inf}$, $\hat{p}_{CABAC}$, τ, $s_{t-τ}$: $s_t$, t, w, $t_{thres}$, List, mode):
    $\hat{p}_{inf}$ ← ProbUpdateCount($\hat{p}_{inf}$, $s_t$, t).
    $\hat{p}_{CABAC}$ ← ProbUpdateCABAC($\hat{p}_{CABAC}$) $s_t$, α).
    $t_{tmp}$ = 0.
    if t > τ then
        List($s_t$; $s_{t-τ}$ : $s_{t-1}$) ← List($s_t$; $s_{t-τ}$ : $s_{t-1}$) + 1.
        $t_{tmp}$ ← τ
        while $t_{tmp}$ > 0 and $Σ_i$ List (i; $s_{t-t_{tmp}}$ + 1: $s_t$) < $t_{thres}$ do
            $t_{tmp}$ ← $t_{tmp}$ - 1.
        end while
        if $t_{tmp}$ > 0 then
            $p_{cond}$ ← $\frac{List(:;s_{t-t_{tmp}} + 1: s_t)}{\sum_i List(i;s_{t-t_{tmp}} + 1: s_t)}$.
        end if
    end if
    if $t_{tmp}$ > 0 then
        if mode then
            p ← $w\hat{p}_{inf}$ + (1 - w)$p_{cond}$.
        else
            p ← $w\hat{p}_{CABAC}$ + (1 - w)$p_{cond}$.
        end if
    else
        if mode then
            p ← $\hat{p}_{inf}$.
```

-continued

```
        else
            p ← $\hat{p}_{CABAC}$.
        end if
    end if
    return p, $\hat{p}_{inf}$, $\hat{p}_{CABAC}$, List.
```

In brief, when the function ProbUpdate is called after $s_t$ is entropy coded by p in the outer loop, the probability estimation models available as the baseline model are used to generate a respective estimated probability ($\hat{p}_{inf}$ and $\hat{p}_{CABAC}$ in this example). Thereafter, $t_{tmp}$, which is used for collecting counts in the dictionary, is initialized to 0. The algorithm next counts and merges probabilities among the dictionary as described above, where i represents each possible outcome of the random symbol, and the summation calculates how many outcomes have been observed within the condition window ($s_{t-t_{tmp}}$+1:$s_t$). This counting and merging ends at the second "end if". The next portion of code queries whether the dictionary is large enough (i.e., if $t_{tmp}$>0), and if so, updates the probability estimation based on which baseline model is selected given the value of mode to update the probability according to one of two calculations. For example, if mode=0, the updated probability p takes on the value $w\hat{p}_{CABAC}$ (1-w)$p_{cond}$ If mode=0, the updated probability p takes on the value $w\hat{p}_{inf}$+(1-w)$p_{cond}$. If instead the dictionary is not large enough (i.e., the response to $t_{tmp}$>0 is no), the baseline estimation $\hat{p}_{CABAC}$ or $\hat{p}_{inf}$ is selected given the value of mode for use as the updated probability.

Thereafter, p, $\hat{p}_{inf}$, $\hat{p}_{CABAC}$, and List are returned so that p can be used to entropy code the next symbol $s_t$, $\hat{p}_{inf}$ and $\hat{p}_{CABAC}$ are available to update the baseline estimation after the next symbol $s_t$ is entropy coded, and List is available to optionally generate the conditional probability $p_{cond}$ after the next symbol $s_t$ is entropy coded.

The function ProbUpdateCABAC called by the function ProbUpdate described above may be represented by the following pseudocode. This pseudocode represents the CABAC update described above, where p is the vector $\hat{p}_{CABAC}$ of the probability distribution, namely [p(1−σ), p(σ)].

```
Def ProbUpdateCABAC(p, $s_t$, α):
    Find LPS: σ = $argmin_{i∈\{0,1\}}$p(i).
    if $s_t$ = σ then
        p(σ) ← max(αp(σ), $p_{62}$).
    else
        p(σ) ← αp(σ) + 1 - α.
    end if
    p(1 - σ) ← 1 - p(σ).
    return p
```

The function ProbUpdateCount called by the function ProbUpdate described above may be represented by the following pseudocode. This pseudocode represents the MLE calculation described above, where p is the vector $\hat{p}_{inf}$ of the probability distribution for the given outcome value $s_t$.

```
Def ProbUpdateCount(p, $s_t$, t):
    $p(s_t) = \frac{t-1}{t}p$.
    $p(s_t) = p(s_t) + \frac{1}{t}$
    return p
```

Other update algorithms for context-based probability estimation are possible. For example, additional algorithms may include a data-driven method that describes learning a linear combination, as opposed to using the fixed combination described above. An implementation for this entropy coding and adaptive probability estimation (as compared to fixed probability estimation) is next described.

In this implementation, instead of using the conditional probability estimated by the previous symbols using List to make a higher-order linear system, the different first-order linear models described above (CABAC, counting (MLE), AV1, etc.) are desirably used as kernels to output a linear combination through actively learning the linear combination. While these three models are used in this example, any probability estimation algorithm may be used. Denote $n_p$ as the number of kernels, $\hat{p} \in \mathbb{R}^{n_p \times 2}$ where each row is a probability estimation, and $w \in \mathbb{R}^{n_p}$ is the weight/parameter of a linear combination. In other words, a weighted average of simple (i.e., first-order) probability estimations is used as the result for entropy coding the next symbol as follows.

$$w^T \hat{p} = \Sigma w_i \hat{p}(i,:)$$

Each row of $\hat{p}$ is updated by a probability update algorithm, and p(1, :) is fixed as an AV1 output. In this way, the AV1 model/algorithm corresponds to the case when $w_0=1$, $w_i=0$, $\forall i \geq 2$. This may be the initialization of linear weights in the pseudocode described below. For this reason, the AV1 model may be referred to as the baseline model.

Thereafter, w is updated. Because it is expected that all update algorithms chosen as kernels should result in an improvement to the output $w^T \hat{p}$, w may be constrained so that $w \geq 0$. This also guarantees that the probability estimation is non-negative. Further, $1^T w=1$ is applied to guarantee that the sum of probability is 1. A stochastic gradient descent (SGD) is used to update w. For each $s_t$, an entropy is incurred as follows.

$$f(w, \hat{p}; s_t) = -\log_2((w^T \hat{p})(s_t))$$

A gradient is taken with respect to w as follows.

$$\nabla_w f(w, \hat{p}, s_t) = -\frac{c}{(w^T \hat{p})(s_t)} \hat{p}(:, s_t), c = 1/\log(2)$$

At time t, a step size $\eta_t = \eta_0/t$ is used, which is standard for SGD, $\eta_t = \eta_0/t^r$ $r \in (0,1)$ are allowed, and stochastic approximation defines $r \in (\frac{1}{2}, 1)$. Then, w is updated by the following gradient step.

$$w \leftarrow \underset{w_+ \geq 0, 1^T w_+ = 1}{\operatorname{argmin}} \|w_+ - (w - \eta_t \nabla_w f(w, \hat{p}; s_t))\|^2$$

Alternatively, a fixed step size $\eta = \eta_0$ can be used to get an inner loop argument that iterates $\tilde{w}_t$ and plug in for final probability estimation $w_t$, which satisfies $w_t = (\Sigma_{i=1}^t \tilde{w}_i)/t$. This cancels out the noise in SGD so that a special diminishing step size or averaging the gradient may be used. A linear dynamic is also proposed for variable iterates $w_{t+1} = \beta w_t + (1-\beta) \tilde{w}_t$ as a faster update. This is the process presented in the pseudocode below.

To update weight w, a constrained optimization step may be included. Solving such a step may be slow. To reduce the number of calls for the step, a batch version the above algorithm may be used. At each epoch, a batch with increasing size 1, 4, 9, 16 . . . , may be taken, and the gradient of the batch is averaged. gradient in this batch. The update of w occurs only at the end of each batch, with a fixed step size $\eta_0$. Both theoretically and empirically, the convergence rate of the SGD and batch versions are similar.

A fast algorithm is next proposed that approximately solves the optimization problem. Namely, the problem may be defined as the following equation.

$$\underset{w_+ \geq 0, 1^T w_+ = 1}{\operatorname{argmin}} \|w_+ - (w - \eta_t \nabla_w f(w, \hat{p}; s_t))\|^2$$

Simplifying the notation results in the following equation.

$$\underset{x \geq 0, 1^T x = 1}{\operatorname{argmin}} \frac{1}{2} \|x - y\|^2$$

Optimality may be obtained from the Lagrangian according to the following equation.

$$L(x, \lambda, \mu) = \frac{1}{2} \|x - y\|^2 - \lambda^T x + \mu(1^T x - 1)$$

The Karush-Kuhn-Tucker (KKT) condition is represented by the following.

$$\nabla_x L(x, \mu) = x - y - \lambda + \mu 1 = 0;$$

$$\lambda \geq 0; x \geq 0; \lambda_i x_i = 0, \forall i.$$

The optimal value for x is represented by the following equation.

$$x_i^* = \max(\gamma_i - \mu, 0).$$

Thus, the following equation may be solved to get $\mu^*$ and $x^* = \max(\gamma - \mu^* 1, 0)$.

$$\max_\mu \frac{1}{2} \|\max(y - \mu 1, 0) - y\|^2 + \mu(1^T \max(y - \mu 1, 0) - 1)$$

Note that the above equation is a one-dimensional convex optimization that can be solved by binary search.

The above data-driven method that describes learning a linear combination may be represented by the following pseudocode, where the input is a sequence of binary symbols as described with respect to the previous implementation. As with the previous implementation, the first step is initialization. During initialization, a variable $n_p$ is set equal to 18, and the probability 3 is set equal to $\hat{p} = 1_{n_p} [0.5, 0.5]$. Further, the variable $w = \tilde{w} = [1, 0, \ldots, 0]^T \in \mathbb{R}^{n_p}$. The variable a is initialized according to $0.99 \cdot 2^{-[0:n_p-2]/4(n_p-2)} \in \mathbb{R}^{n_p-2}$. Other variables are initialized as follows: $\eta_0 = 5$, r=1, b_=b=0, g=$0^{n_p}$, $\beta$=0.95, and $\alpha_{min}$=0.84, r$\in(\frac{1}{2}, 1)$. The algorithm chooses the mode from SGD decreasing step size, SGD average argument, SGD dynamic argument, or SGD batch. It is worth noting that when the mode is SGD decreasing step size, it can be solved by the fast projected optimization algorithm described above.

As with the fixed probability estimation described above, parameters or variables used for the entropy coding and probability of estimation are defined, initialized, or otherwise determined, either before, after, or concurrent with receipt of the sequence at 902. Then, the remaining steps of the method 900 are performed according to the following pseudocode starting with receiving the first symbol $s_1$ and entropy coding the first symbol $s_1$. Then, the probability estimations are updated using the respective models. The functions ProbUpdateCount and ProbUpdateCABAC have been discussed above. The function ProbUpdateAV1 is described below. Once the probability estimations are updated, they are combined using the selected mode.

Note that NumOfSyms (the number of symbols) is 2 in this example, but it could be a higher number. Also note that a is used as an input to ProbUpdateCABAC. While it is a constant in these examples, this would allow the value to be adaptive.

Below is a table of the entropy resulting for various binary sequences using different context-based probability estima-

```
while t ≤ N do
    Receive symbol sₜ.
    Entropy code sₜ by wᵀp̂.
    p̂(1, :) ← ProbUpdateAV1(p̂(1, :), sₜ, t, NumOfSyms).
    p̂(2, :) ← ProbUpdateCount(p̂(2, :), sₜ, t).
    p̂(i, :) ← ProbUpdateCABAC(p̂(i, :), sₜ, αᵢ₋₂) for all 3 ≤ i ≤ nₚ.
    if SGD decreasing step size then
```

$$w \leftarrow \underset{w_+ \geq 0, 1^T w_+ = 1}{\arg\min} \left\| w_+ - \left( w - \frac{\eta_0}{t^\tau} \cdot \frac{\hat{p}(:, s_t)}{(w^T \hat{p})(s_t)} \right) \right\|^2.$$

else if SGD average argument then $$\tilde{w} \leftarrow \underset{w_+ \geq 0, 1^T w_+ = 1}{\arg\min} \left\| w_+ - \left( \tilde{w} - \eta_0 \cdot \frac{\hat{p}(:, s_t)}{(\tilde{w}^T \hat{p})(s_t)} \right) \right\|^2.$$

$$w \leftarrow \left(1 - \frac{1}{t+1}\right) w + \frac{1}{t+1} \tilde{w}. \; \backslash\backslash = \frac{1}{t+1} \sum_{k=1}^{t+1} \tilde{w}_i$$

else if SGD dynamic argument then $$\tilde{w} \leftarrow \underset{w_+ \geq 0, 1^T w_+ = 1}{\arg\min} \left\| w_+ - \left( \tilde{w} - \eta_0 \cdot \frac{\hat{p}(:, s_t)}{(\tilde{w}^T \hat{p})(s_t)} \right) \right\|^2.$$

```
    w ← βw + (1 − β)w̃.
else if SGD batch then
    if t ≤ b then
```

$$g \leftarrow g + \frac{1}{b - b_- + 1} \frac{1}{(w^T \hat{p})(s_t)} \hat{p}(:, s_t) \quad \backslash\backslash \text{ Batch from } b_- \text{ to } b, \text{ size } 1, 4, 9,$$

16, ...
    end if
    if t = b then $$w \leftarrow \underset{w_+ \geq 0, 1^T w_+ = 1}{\arg\min} \| w_+ - (w - \eta_0 g) \|^2.$$

```
        g ← 0^{nₚ}.
        b₊ ← b + (√(b−b_+1) + 1)², b_ ← b + 1, b ← b₊. \\ Update batch.
    end if
    end if
    t ← t + 1.
end while
```

The function ProbUpdateAV1 may be represented by the following pseudocode. This pseudocode represents the AV1 calculation described above, where p is the vector $\hat{p}(1, :)$ of the probability distribution for the given outcome value $s_t$.

```
Def ProbUpdateAV1(p, s, t, NumOfSyms):
    p₀ ← 0.0076.
    r ← 3 + (t > 15) + (t > 31) + (NumOfSyms > 2) + (NumOfSyms > 4)
    p ← max((1 − 2⁻ʳ)p, p₀).
    p(s) ← p(s) + 1 − Σᵢ₌₁^{NumOfSyms} p(i)
    return p
``` tion techniques described herein. The table compares six techniques using nine different test sequences. The conventional CABAC and AV1 models/algorithms are baselines, against which different proposed models/algorithms are compared. As can be seen from the left-most column, the models for comparison are the SGD processing without SGD batch processing, the SGD batch processing, the fixed combination update algorithm for context-based probability estimation described with the parameters/variables above, and the fixed combination update algorithm for context-based probability estimation described with the parameters/variables above except that mode is set equal to 1 instead of 0. The proposed algorithms perform better than the baselines in most conditions. The differences generally relate to the parameter $p_{62}$ in CABAC. Too sparse a dataset results in worse entropy when using this parameter.

|  | allzbk 16.0 | allzbk 8.0 | zblk 4.0 | zblk 8.0 | allzbk 16.1 | allzbk 8.1 | zblk 4.1 | allzbk 16.2 | allzbk 8.2 |
|---|---|---|---|---|---|---|---|---|---|
| SGD | 2423 | 3160 | 1299 | 757.9/ 689.1 | 245.0 | 504.2 | 96.71 | 352.8 | 748.3 |
| Batch | 2410 | 3160 | 1311 | 730.1/ 703.1 | 243.8 | 503.5 | 98.28 | 353.3 | 747.1 |
| Fixed | 2404 | 3165 | 1312 | 779.0/ 689.1 | 246.6 | 508.1 | 95.90 | 354.6 | 749.7 |
| Modified Fixed | 2414 | 3184 | 1410 | 712.5 | 248.2 | 500.2 | 96.04 | 354.3 | 744.4 |
| CABAC | 2457 | 3209 | 1311 | 792.3 | 247.2 | 510.1 | 96.05 | 356.0 | 754.6 |
| AV1 | 2479 | 3177 | 1322 | 692.5 | 248.2 | 505.6 | 97.11 | 354.0 | 751.3 |

The underlying probability model from which symbols are emitted in video coding is typically unknown and/or is likely too complex to be fully described. As such, designing a good model for use in entropy coding can be a challenging problem in video coding. For example, a model that works well for one sequence may perform poorly for another sequence. A model, as used herein, can be, or can be a parameter in, lossless (entropy) coding. A model can be any parameter or method that affects probability estimation for the purpose of entropy coding. For example, a model can define the probability to be used to encode and decode the decision at an internal node in a token tree (such as described with respect to FIG. 7). In such a case, the two-pass process to learn the probabilities for a current frame may be simplified to a single-pass process by modifying a baseline model for probability estimation as described herein. In another example, a model may define a certain context derivation method. In such a case, implementations according to this disclosure can be used to combing probability estimations generated by a multitude of such methods. In yet another example, a model may define a completely new lossless coding algorithm.

The probability update algorithm for entropy coding described herein may incorporate an average of different models with fast and slow update rates. An MLE estimator based on counting may be incorporated. Conditional probability and dictionary searching are options. The implementations also allow for adaptive fusion of models.

For simplicity of explanation, the techniques herein are each depicted and described as a series of blocks, steps, or operations. However, the blocks, steps, or operations in accordance with this disclosure can occur in various orders and/or concurrently. Additionally, other steps or operations not presented and described herein may be used. Furthermore, not all illustrated steps or operations may be required to implement a technique in accordance with the disclosed subject matter.

The aspects of encoding and decoding described above illustrate some examples of encoding and decoding techniques. However, it is to be understood that encoding and decoding, as those terms are used in the claims, could mean compression, decompression, transformation, or any other processing or change of data.

The word "example" is used herein to mean serving as an example, instance, or illustration. Any aspect or design described herein as "example" is not necessarily to be construed as being preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise or clearly indicated otherwise by the context, the statement "X includes A or B" is intended to mean any of the natural inclusive permutations thereof. That is, if X includes A; X includes B; or X includes both A and B, then "X includes A or B" is satisfied under any of the foregoing instances. In addition, the articles "a" and "an" as used in this application and the appended claims should generally be construed to mean "one or more," unless specified otherwise or clearly indicated by the context to be directed to a singular form. Moreover, use of the term "an implementation" or the term "one implementation" throughout this disclosure is not intended to mean the same implementation unless described as such.

Implementations of the transmitting station 102 and/or the receiving station 106 (and the algorithms, methods, instructions, etc., stored thereon and/or executed thereby, including by the encoder 400 and the decoder 500) can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably. Further, portions of the transmitting station 102 and the receiving station 106 do not necessarily have to be implemented in the same manner.

Further, in one aspect, for example, the transmitting station 102 or the receiving station 106 can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

The transmitting station 102 and the receiving station 106 can, for example, be implemented on computers in a video conferencing system. Alternatively, the transmitting station 102 can be implemented on a server, and the receiving station 106 can be implemented on a device separate from the server, such as a handheld communications device. In this instance, the transmitting station 102, using an encoder 400, can encode content into an encoded video signal and transmit the encoded video signal to the communications device. In turn, the communications device can then decode the encoded video signal using a decoder 500. Alternatively, the communications device can decode content stored locally on the communications device, for example, content that was not transmitted by the transmitting station 102. Other suitable transmitting and receiving implementation schemes are available. For example, the receiving station 106 can be a generally stationary personal computer rather than a portable communications device, and/or a device including an encoder 400 may also include a decoder 500.

Further, all or a portion of implementations of this disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or semiconductor device. Other suitable mediums are also available.

The above-described implementations and other aspects have been described to facilitate easy understanding of this disclosure and do not limit this disclosure. On the contrary, this disclosure is intended to cover various modifications and equivalent arrangements included within the scope of the appended claims, which scope is to be accorded the broadest interpretation as is permitted under the law to encompass all such modifications and equivalent arrangements.

What is claimed is:

1. A method for entropy coding a sequence of symbols, comprising:
   determining a first probability model for entropy coding the sequence, the first probability model being one of a plurality of available probability models;
   entropy coding at least one symbol of the sequence using a probability determined by the first probability model;
   after entropy coding the at least one symbol of the sequence, determining a first probability estimation to update the probability using the first probability model;
   determining a second probability estimation to update the probability using a second probability model, wherein the second probability model is a different model to the first probability model; and
   entropy coding a subsequent symbol relative to the at least one symbol of the sequence using the probability updated by a combination of the first probability estimation and the second probability estimation.

2. The method of claim 1, wherein the first probability model comprises a context-adaptive binary arithmetic coding (CABAC) model or an AV1 model.

3. The method of claim 1, wherein the first probability model comprises a Maximum Likelihood Estimate of a Bernoulli distribution.

4. The method of claim 1, wherein the at least one symbol comprises multiple symbols up to a minimum number of symbols.

5. The method of claim 1, further comprising:
   forming the combination as a linear combination of the first probability estimation and the second probability estimation.

6. The method of claim 1, wherein:
   the combination is a weighted combination of the first probability estimation and the second probability estimation.

7. The method of claim 6, wherein the weighted combination uses a fixed weight.

8. The method of claim 6, wherein the weighted combination uses a variable weight.

9. The method of claim 1, wherein the at least one symbol comprises a first symbol, the method comprising:
   entropy coding each symbol after the first symbol using the probability used for entropy coding a previous symbol updated using a combination of the first probability estimation and the second probability estimation.

10. An apparatus, comprising:
    a processor configured to:
    determine a first probability model for entropy coding a sequence, the first probability model being one of a plurality of available probability models;
    entropy code at least one symbol of the sequence using a probability determined by the first probability model;
    after entropy coding the at least one symbol of the sequence, determine a first probability estimation to update the probability using the first probability model;
    determine a second probability estimation to update the probability using a second probability model, wherein the second probability model is a different model to the first probability model; and
    entropy code a subsequent symbol relative to the at least one symbol of the sequence using the probability updated by a combination of the first probability estimation and the second probability estimation.

11. The apparatus of claim 10, wherein the first probability model comprises a Maximum Likelihood Estimate of a Bernoulli distribution.

12. The apparatus of claim 11, wherein the combination uses an adaptive weighting of the first probability estimation and the second probability estimation.

13. The apparatus of claim 10, wherein the at least one symbol comprises multiple symbols up to a minimum number of symbols.

14. The apparatus of claim 10, wherein the processor is configured to:
    form the combination as a linear combination of the first probability estimation and the second probability estimation.

15. The apparatus of claim 10, wherein:
    the combination is a weighted combination of the first probability estimation and the second probability estimation, and the weighted combination uses one of a fixed weight or a variable weight.

16. The apparatus of claim 10, wherein the processor is configured to:
    determine a third probability estimation to update the probability using a third probability model, wherein the combination comprises a combination of the first probability estimation, the second probability estimation, and the third probability estimation, and the third probability model is different model to each of the first probability model and the second probability model.

17. The apparatus of claim 16, wherein the combination of the first probability estimation, the second probability estimation, and the third probability estimation is a linear combination using a weighted average of the first probability estimation, the second probability estimation, and the third probability estimation.

18. The apparatus of claim 17, wherein a weight used for the weighted average is updated using a stochastic gradient descent (SGD).

19. The apparatus of claim 18, wherein the first probability model comprises an SGD decreasing step size, an SGD average argument, an SGD dynamic argument, or a SGD batch.

20. The apparatus of claim 10, wherein the at least one symbol comprises a first symbol, and the processor is configured to:
   entropy code each symbol after the first symbol using the probability used for entropy coding a previous symbol updated using a combination of the first probability estimation and the second probability estimation.

* * * * *